(12) United States Patent
Hori et al.

(10) Patent No.: US 6,392,338 B1
(45) Date of Patent: May 21, 2002

(54) ORGANIC LIGHT EMITTER HAVING OPTICAL WAVEGUIDE FOR PROPAGATING LIGHT ALONG THE SURFACE OF THE SUBSTRATE

(75) Inventors: Yoshikazu Hori, Kawasaki; Masao Fukuyama, Tokyo, both of (JP)

(73) Assignee: Matsushita Electrical Industrial Co., Ltd., Osaka (JP)

( * ) Notice: Subject to any disclaimer, the term of this patent is extended or adjusted under 35 U.S.C. 154(b) by 0 days.

(21) Appl. No.: 09/267,354

(22) Filed: Mar. 15, 1999

(30) Foreign Application Priority Data

Apr. 23, 1998 (JP) .......................... 11-113149
May 15, 1998 (JP) .......................... 10-132991

(51) Int. Cl.[7] .................. H05B 33/00; H05B 33/24; G02B 6/10
(52) U.S. Cl. .................. 313/504; 313/506; 385/129
(58) Field of Search .................. 313/504, 506, 313/509, 512; 428/690, 917; 315/169.3; 385/120, 124, 129; 257/40, 98

(56) References Cited

U.S. PATENT DOCUMENTS

| | | | |
|---|---|---|---|
| 5,307,363 A | | 4/1994 | Hosokawa et al. |
| 5,405,710 A | | 4/1995 | Dodabalapur et al. |
| 5,478,658 A | | 12/1995 | Dodabalapur et al. |
| 5,907,160 A | * | 5/1999 | Wilson et al. .......... 257/40 |
| 5,940,568 A | * | 8/1999 | Losch .................. 385/129 |
| 6,111,902 A | * | 8/2000 | Kozlov et al. ......... 372/39 |
| 6,160,828 A | * | 12/2000 | Kozlov et al. ......... 372/39 |

FOREIGN PATENT DOCUMENTS

| | | |
|---|---|---|
| JP | 4-237993 | 8/1992 |
| JP | 5-327109 | 12/1993 |
| JP | 6-283271 | 10/1994 |
| JP | 7-320864 | 12/1995 |
| JP | 8-8061 | 1/1996 |
| JP | 8-213174 | 8/1996 |
| JP | 9-501004 | 1/1997 |
| JP | 9-180883 | 7/1997 |
| WO | WO 95/03621 | 2/1995 |

OTHER PUBLICATIONS

"Organic electroluminescent diodes" by Tang et al; Appl. Phys. Lett. vol. 51, No. 12, Sep., 21, 1987; pp. 913–915.

* cited by examiner

Primary Examiner—Nimeshkumar D. Patel
Assistant Examiner—Karabi Guharay
(74) Attorney, Agent, or Firm—Connelly Bove Lodge & Hutz LLP

(57) ABSTRACT

An organic light emitter includes an anode and a cathode. A first layer of organic material includes a light emitting layer. The first layer extends between the anode and the cathode. A second layer has a refractive index higher than a refractive index of the light emitting layer. The second layer is optically coupled to the light emitting layer, causing an optical waveguide which propagates light generated by the light emitting layer along a direction parallel to a surface of a substrate. At least part of the optical waveguide has an effective refractive index which spatially and periodically varies in a direction parallel to the surface of the substrate.

35 Claims, 13 Drawing Sheets

ORGANIC LIGHT EMITTER HAVING OPTICAL WAVEGUIDE FOR PROPAGATING LIGHT ALONG THE SURFACE OF THE SUBSTRATE

BACKGROUND OF THE INVENTION

1. Field of the Invention

This invention relates to a light emitter including an organic material such as an organic semiconductor.

2. Description of the Related Art

C. W. Tang et al. reported an electroluminescent (EL) device which uses an organic material as a light emitting element (C. W. Tang et al. Appl. Phys. Lett. Vol. 51, p. 913, 1987).

The Tang's EL device includes a glass substrate coated with a film of indium tin oxide (ITO). A first organic layer of an aromatic diamine extends on the ITO film. A second organic layer extends on the first organic layer. The second organic layer is a luminescent film which belongs to a class of fluorescent metal chelate complexes. An example thereof is 8-hydroxyquinoline aluminum (Alq3). A top electrode extends on the second organic layer. The top electrode is an alloy or mixture of magnesium (Mg) and silver (Ag). A direct-current power source is connected between the ITO film and the top electrode. The ITO film serves as an anode while the Mg:Ag electrode operates as a cathode. In the Tang's EL device, efficient injection of holes and electrons is provided from the ITO anode and the Mg:Ag cathode. Electron-hole recombination and green electroluminescent emission are confined near the organic interface region. A high external quantum efficiency (1% photon/electron), a high luminous efficiency (1.5 lm/W), and a great brightness (>1000 cd/m$^2$) are achievable at a driving voltage below 10 V.

Some prior-art light emitters including organic layers are equipped with optical microcavities for narrowing spectrum widths of emitted light.

There are known organic light emitters which have waveguiding arrangements and light-amplifying structures.

SUMMARY OF THE INVENTION

It is an object of this invention to provide an improved organic light emitter.

A first aspect of this invention provides an organic light emitter comprising an anode; a cathode; a first layer of organic material which includes a light emitting layer, and which extends between the anode and the cathode; a second layer having a refractive index higher than a refractive index of the light emitting layer; a substrate; and means for optically coupling the second layer and the light emitting layer to cause an optical waveguide which propagates light generated by the light emitting layer along a direction parallel to a surface of the substrate; wherein at least part of the optical waveguide has an effective refractive index which spatially and periodically varies in a direction parallel to the surface of the substrate.

A second aspect of this invention provides an organic light emitter comprising an anode; a cathode; a first layer of organic material which includes a light emitting layer, and which extends between the anode and the cathode; a substrate; and a second layer having a refractive index higher than a refractive index of the light emitting layer, and being optically coupled to the light emitting layer to cause an optical waveguide which propagates light generated by the light emitting layer along a direction parallel to a surface of the substrate; wherein at least part of the optical waveguide has an effective refractive index which spatially and periodically varies in a direction parallel to the surface of the substrate to cause an optical resonator operating on the light generated by the light emitting layer.

A third aspect of this invention provides an organic light emitter comprising an anode; a cathode; a first layer of organic material which includes a light emitting layer, and which extends between the anode and the cathode; a substrate; and a second layer having a refractive index higher than a refractive index of the light emitting layer, and being optically coupled to the light emitting layer to cause an optical waveguide which propagates light generated by the light emitting layer; wherein the second layer includes at least first and second regions separate from each other, and the first region has an effective refractive index which spatially and periodically varies at a first predetermined period, and the second region has an effective refractive index which spatially and periodically varies at a second predetermined period different from the first predetermined period.

A fourth aspect of this invention is based on the first aspect thereof, and provides an organic light emitter wherein an optical length corresponding to a period of the variation in the effective refractive index of the optical waveguide is equal to an integer multiple of a half of a wavelength of the light generated by the light emitting layer.

A fifth aspect of this invention is based on the fourth aspect thereof, and provides an organic light emitter wherein the optical length corresponding to the period of the variation in the effective refractive index of the optical waveguide is equal to the half of the wavelength of the light generated by the light emitting layer.

A sixth aspect of this invention is based on the fourth aspect thereof, and provides an organic light emitter wherein the optical length corresponding to the period of the variation in the effective refractive index of the optical waveguide is equal to the wavelength of the light generated by the light emitting layer.

A seventh aspect of this invention is based on the first aspect thereof, and provides an organic light emitter wherein the optical waveguide is adjacent to the light emitting layer, and one of the anode and the cathode includes a transparent electrode, and the light generated by the light emitting layer is outputted to an external via the transparent electrode, and the outputted light forms a beam having a plane shape.

An eighth aspect of this invention provides an organic light emitter comprising an anode; a cathode; a layer of organic material which includes a light emitting layer, and which extends between the anode and the cathode; a substrate; and a transparent layer being adjacent to and optically coupled to the light emitting layer and having a refractive index which is higher than a refractive index of the light emitting layer to cause an optical wavelength; wherein the refractive index of the transparent layer spatially and periodically varies, and the optical waveguide propagates light emitted by the light emitting layer and has an effective refractive index which spatially and periodically varies in a direction parallel to a surface of the substrate in accordance with the spatial periodic variation in the refractive index of the transparent layer.

A ninth aspect of this invention is based on the eighth aspect thereof, and provides an organic light emitter wherein the transparent layer includes one of the anode and the cathode, and has a composition which spatially and periodically varies in a predetermined direction with respect to the transparent layer.

A tenth aspect of this invention is based on the eighth aspect thereof, and provides an organic light emitter wherein the transparent layer includes one of the anode and the cathode, and has a thickness which spatially and periodically varies in a predetermined direction with respect to the transparent layer.

An eleventh aspect of this invention provides an organic light emitter comprising an anode; a cathode; a layer of organic material which includes a light emitting layer, and which extends between the anode and the cathode; a substrate; a first transparent layer being adjacent to the light emitting layer and having a refractive index which is higher than a refractive index of the light emitting layer; and a second transparent layer having a refractive index which spatially and periodically varies; wherein the first and second transparent layers cause an optical waveguide, and the optical waveguide propagates light emitted by the light emitting layer and has an effective refractive index which spatially and periodically varies in a direction parallel to a surface of the substrate in accordance with the spatial period variation in the refractive index of the second transparent layer.

A twelfth aspect of this invention provides an organic light emitter comprising an anode; a cathode; a transparent electrode including one of the anode and the cathode; a layer of organic material which includes a light emitting layer, and which extends between the anode and the cathode; a substrate; and a transparent layer extending between the transparent electrode and the light emitting layer, and having a refractive index which is higher than a refractive index of the light emitting layer to cause an optical waveguide; wherein the refractive index of the transparent layer spatially and periodically varies, and the optical waveguide propagates light emitted by the light emitting layer and has an effective refractive index which spatially and periodically varies in a direction parallel to a surface of the substrate in accordance with the spatial periodic variation in the refractive index of the transparent layer.

A thirteenth aspect of this invention is based on the twelfth aspect thereof, and provides an organic light emitter wherein the transparent electrode has a refractive index higher than a refractive index of the light emitting layer.

A fourteenth aspect of this invention is based on the eleventh aspect thereof, and provides an organic light emitter wherein the second transparent layer includes a film of organic material, and the organic material film has a composition which spatially and periodically varies in a predetermined direction with respect to the organic material film.

A fifteenth aspect of this invention is based on the eleventh aspect thereof, and provides an organic light emitter wherein the second transparent layer includes a dielectric layer, and the dielectric layer has a composition which spatially and periodically varies in a predetermined direction with respect to the dielectric layer.

A sixteenth aspect of this invention is based on the eleventh aspect thereof, and provides an organic light emitter wherein the second transparent layer includes a dielectric layer, and the dielectric layer has a thickness which spatially and periodically varies in a predetermined direction with respect to the dielectric layer.

A seventeenth aspect of this invention is based on the eleventh aspect thereof, and provides an organic light emitter wherein the second transparent layer includes a plurality of dielectric layers, and at least one of the dielectric layers has a thickness and a composition one of which spatially and periodically varies in a predetermined direction with respect to the dielectric layer.

An eighteenth aspect of this invention is based on the third aspect thereof, and provides an organic light emitter wherein the second layer includes first, second, and third regions separate from each other, and the first region has an effective refractive index which spatially and periodically varies at a first predetermined period corresponding to a wavelength of red light, and the second region has an effective refractive index which spatially and periodically varies at a second predetermined period corresponding to a wavelength of green light, and the third region has an effective refractive index which spatially and periodically varies at a third predetermined period corresponding to a wavelength of blue light.

A nineteenth aspect of this invention provides an organic light emitter comprising an anode; a cathode; a first layer of organic material which includes a light emitting layer, and which extends between the anode and the cathode; a second layer having a refractive index higher than a refractive index of the light emitting layer to cause an optical waveguide for propagating light generated by the light emitting layer; and a portion for enabling a density of a current in the light emitting layer to periodically vary in a spatial domain.

A twentieth aspect of this invention provides an organic light emitter comprising an anode; a cathode; a first layer of organic material which includes a light emitting layer, and which extends between the anode and the cathode; an optical waveguide for propagating light generated by the light emitting layer; and a portion for enabling a density of a current in the light emitting layer to periodically vary in a spatial domain; wherein an effective refractive index of the optical waveguide spatially and periodically varies in accordance with the spatially periodic variation in the current density so that an optical resonator is caused which operates on the light generated by the light emitting layer.

A twenty-first aspect of this invention provides an organic light emitter comprising an anode; a cathode; a first layer of organic material which includes a light emitting layer, and which extends between the anode and the cathode; a substrate; a second layer optically coupled to the light emitting layer and having a refractive index higher than a refractive index of the light emitting layer to cause an optical waveguide for propagating light generated by the light emitting layer in a direction parallel to a surface of the substrate; and a portion for enabling a density of a current in the light emitting layer to periodically vary in a spatial domain.

A twenty-second aspect of this invention is based on the twentieth aspect thereof, and provides an organic light emitter wherein an optical length corresponding to a period of the variation in the effective refractive index of the optical waveguide is equal to an integer multiple of a half of a wavelength of the light generated by the light emitting layer.

A twenty-third aspect of this invention is based on the twentieth aspect thereof, and provides an organic light emitter wherein the optical length corresponding to the period of the variation in the effective refractive index of the optical waveguide is equal to the wavelength of the light generated by the light emitting layer.

A twenty-fourth aspect of this invention is based on the nineteenth aspect thereof, and provides an organic light emitter wherein one of the anode and the cathode includes a transparent electrode, and the light generated by the light emitting layer is outputted to an external via the transparent electrode, and the outputted light forms a polarized beam.

A twenty-fifth aspect of this invention is based on the nineteenth aspect thereof, and provides an organic light emitter wherein the portion includes the cathode which has a spatially periodic structure.

A twenty-sixth aspect of this invention is based on the twenty fifth aspect thereof, and provides an organic light emitter wherein the second layer includes a transparent dielectric layer.

A twenty-seventh aspect of this invention is based on the twenty-fifth aspect thereof, and provides an organic light emitter wherein the second layer includes a transparent electrode forming the anode.

A twenty-eighth aspect of this invention is based on the nineteenth aspect thereof, and provides an organic light emitter wherein the portion includes the anode which has a spatially periodic structure.

A twenty-ninth aspect of this invention is based on the twenty-eighth aspect thereof, and provides an organic light emitter wherein the second layer includes a transparent dielectric layer.

A thirtieth aspect of this invention is based on the twentyeighth aspect thereof, and provides an organic light emitter wherein the second layer includes a transparent electrode forming the anode.

A thirty-first aspect of this invention is based on the nineteenth aspect thereof, and provides an organic light emitter wherein the portion includes current blocking segments extending between the anode and the cathode, and spaced at a predetermined period.

A twenty-second aspect of this invention is based on the thirty-first aspect thereof, and provides an organic light emitter wherein the second layer includes a transparent dielectric layer.

A thirty-third aspect of this invention is based on the nineteenth aspect thereof, and provides an organic light emitter wherein the portion includes a plurality of different regions for enabling the current density to vary in the spatial domain at different periods respectively.

A thirty-fourth aspect of this invention is based on the nineteenth aspect thereof, and provides an organic light emitter wherein the portion includes first, second, and third regions separate from each other, the first region enabling the current density to vary in the spatial domain at a first predetermined period corresponding to a wavelength of red light, the second region enabling the current density to vary in the spatial domain at a second predetermined period corresponding to a wavelength of green light, the third region enabling the current density to vary in the spatial domain at a third predetermined period corresponding to a wavelength of blue light.

A thirty-fifth aspect of this invention is based on the thirty-third aspect thereof, and provides an organic light emitter wherein the optical waveguide is formed with current injection regions having periods in different directions respectively.

DESCRIPTION OF THE PREFERRED EMBODIMENTS

First Embodiment

Figure 1:
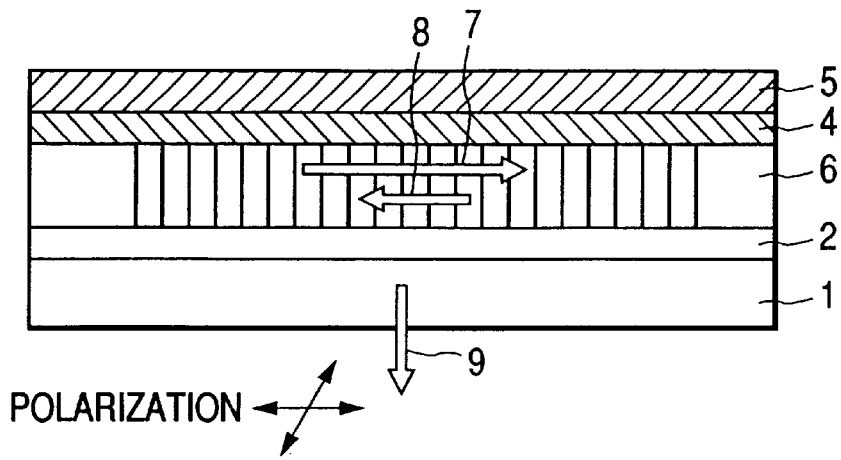
FIG. 1 is a sectional view of an organic light emitter according to a first embodiment of this invention.

FIG. 1 shows an organic light emitter according to a first embodiment of this invention. The organic light emitter of FIG. 1 has a multi-layer structure or a laminated structure as will be made clear later. The organic light emitter of FIG. 1 includes a glass substrate 1 having a flat upper surface. A transparent electrode layer 2 is formed on the upper surface of the glass substrate 1. The transparent electrode layer 2 is made of, for example, indium tin oxide (ITO). A transparent semiconductor layer 6 is formed on the transparent electrode layer 2. An organic light emitting layer 4 is formed on the transparent semiconductor layer 6. A metal electrode layer 5 is formed on the organic light emitting layer 4.

The organic light emitting layer 4 includes an organic semiconductor film containing an active layer, that is, a light emitting layer. The transparent semiconductor layer 6 has a refractive index which spatially and periodically varies in a direction parallel to the planes of the boundaries with the transparent electrode layer 2 and the organic light emitting layer 4, for example, in a left-right or horizontal direction as viewed in FIG. 1.

Preferably, the variation of the refractive index of the transparent semiconductor layer 6 has a given constant period.

Figure 2:
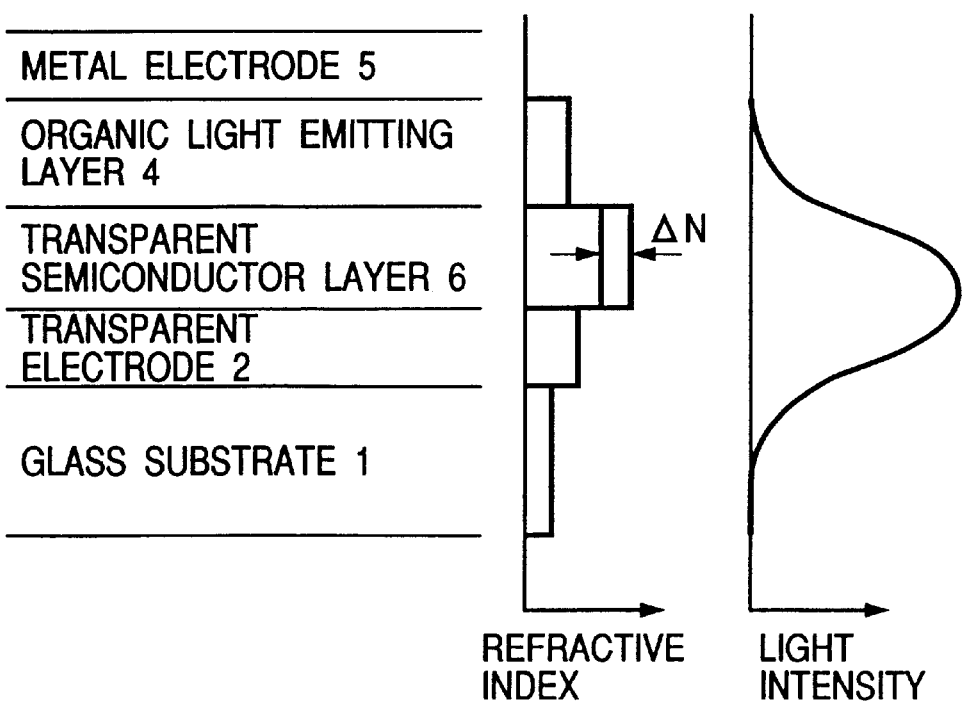
FIG. 2 is a diagram of the refractive indexes of members and the intensity of generated light in the organic light emitter of FIG. 1.

As shown in FIG. 2, the refractive index of the transparent semiconductor layer 6 is in a given range ΔN higher than the refractive index of the organic light emitting layer 4. Preferably, the refractive index of the transparent semiconductor layer 6 is higher than that of the transparent electrode layer 2. Preferably, the refractive index of the transparent electrode layer 2 is higher than the refractive indexes of the organic light emitting layer 4 and the glass substrate 1.

An electric power source (not shown), for example, a direct-current power source, is connected between the transparent electrode layer 2 and the metal electrode layer 5 to apply a driving voltage to the organic light emitter. Carries are injected into the organic light emitting layer 4 from the transparent electrode layer 2 and the metal electrode layer 5 by the driving voltage. The injected carriers cause light. In this way, the light is generated in the organic light emitting layer 4. The generated light is propagated from the organic light emitting layer 4 to the transparent semiconductor layer 6.

The transparent semiconductor layer 6 which has the periodically-varying high refractive index provides the following effect. As shown in FIG. 2, the generated light is confined in a region between the two low-refractive-index layers, that is, the organic light emitting layer 4 and the glass substrate 1. Specifically, the generated light is confined mainly in the transparent semiconductor layer 6. The generated light is propagated in an optical waveguide as a forward light beam 7 (see FIG. 1) along a direction parallel to the upper surface of the glass substrate 1, that is, a direction parallel to the plane of the boundary between the glass substrate 1 and the transparent electrode layer 2. The optical waveguide includes the transparent semiconductor layer 6 in which the refractive index varies at the constant period. A component of the forward light beam 7 which has a wavelength tuning to the period of the variation in the refractive index of the transparent semiconductor layer 6 is reflected by diffraction, thereby forming a backward light beam 8 (see FIG. 1). The direction of the travel of the backward light beam 8 is opposite to the direction of the travel of the forward light beam 7. The backward light beam 8 interferes with the component of the forward light beam 7 which has the same wavelength as that of the backward light beam 8. The interference causes a greater resultant light beam having a specified wavelength corresponding to the wavelength of the backward light beam 8. In other words, the transparent semiconductor layer 6 causes an optical resonator which extends in a direction parallel to the upper surface of the glass substrate 1. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 1 before being emitted to an external via a lower surface of the glass substrate 1.

In the case where the optical length corresponding to the period of the variation in the effective refractive index of the optical waveguide (the transparent semiconductor layer 6) is equal to an integer multiple of a half of the generated light wavelength, a low-order diffraction light beam is emitted outward via the lower surface of the glass substrate 1. Especially, in the case where the optical length is equal to about the generated light wavelength, a 1-order diffraction light beam 9 (see FIG. 1) is emitted outward via the lower surface of the glass substrate 1 along a direction perpendicular to the lower surface of the glass substrate 1.

The optical resonator provides a high color purity or a high monochromatism of the emitted light beam. In the case where three organic light emitters of this embodiment are prepared and optical resonators therein are tuned to a red region, a green region, and a blue region respectively, it is possible to provide a multi-color light beam having a high color quality.

The optical waveguide (the transparent semiconductor layer 6) effectively diffracts only components of the generated light which have vibration displacement directions parallel to a direction of a structure of the spatial periodic variation in the refractive index.

Accordingly, an outgoing light beam emitted from the optical waveguide toward an external is mainly polarized in a direction corresponding to the structure of the spatial periodic variation in the refractive index. Thus, the polarization direction of the outgoing light beam is determined by the direction in which the structure of the spatial periodic variation in the refractive index is formed.

The transparent semiconductor layer 6 may be replaced by two separate layers. In this case, one layer has a refractive index higher than the refractive indexes of the organic light emitting layer 4 and the transparent electrode layer 2, and the other layer has a refractive index which spatially and periodically varies.

The refractive index of the transparent semiconductor layer 6 may be lower than that of the transparent electrode layer 2. Preferably, the refractive index of the transparent electrode layer 2 is higher than that of the organic light emitting layer 4. In this case, the optical waveguide is formed mainly by the transparent electrode layer 2. Accordingly, provided that a layer having a spatial periodic variation in refractive index exists near the organic light emitting layer 4 or the transparent electrode layer 2, there are an optical waveguide having a structure of a spatial periodic variation in refractive index and also an optical resonator with an optical waveguide.

The transparent semiconductor layer 6 may be located between the glass substrate 1 and the transparent electrode layer 2, or between the organic light emitting layer 4 and the metal electrode layer 5.

Figure 22:
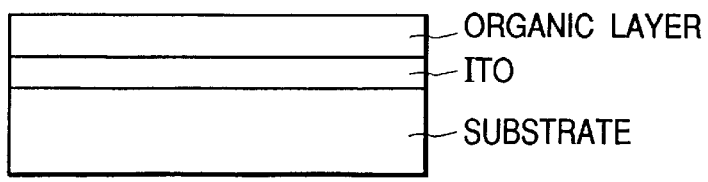
FIGS. 22–27 are sectional views of a glass substrate and layers thereon which relate to different stages during the fabrication of the organic light emitter in FIG. 1.

The organic light emitter of FIG. 1 is fabricated as follows. With reference to FIG. 22, a glass substrate is prepared, and then an ITO (indium tin oxide) layer and an organic semiconductor layer are successively formed on the glass substrate by vapor deposition. Photoresist is applied onto the organic semiconductor layer by spin coating. As a result, a layer of photoresist is formed on the organic semiconductor layer.

Figure 23:
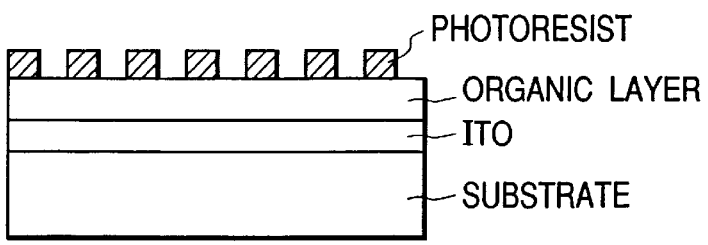

As shown in FIG. 23, the photoresist layer is made into a given shape by a patterning process using a mask. The resultant photoresist layer has segments spaced at equal intervals as viewed in a horizontal direction. As a result of the patterning process, portions of the organic semiconductor layer are exposed. The combination of the layers and the glass substrate is subjected to a dry etching process so that portions of the organic semiconductor layer which are uncovered from the photoresist segments are removed. At the same time, portions of the ITO layer are exposed.

Figure 24:
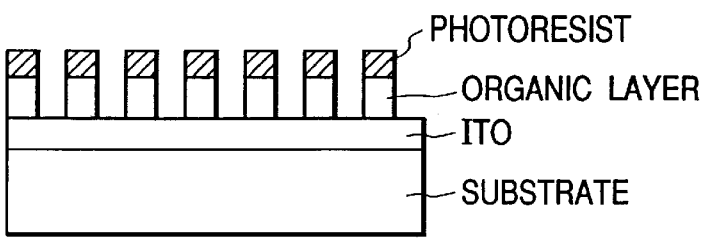

As shown in FIG. 24, remaining portions of the organic semiconductor layer extend below the photoresist segments, and are spaced at equal intervals as viewed along a horizontal direction.

Figure 25:
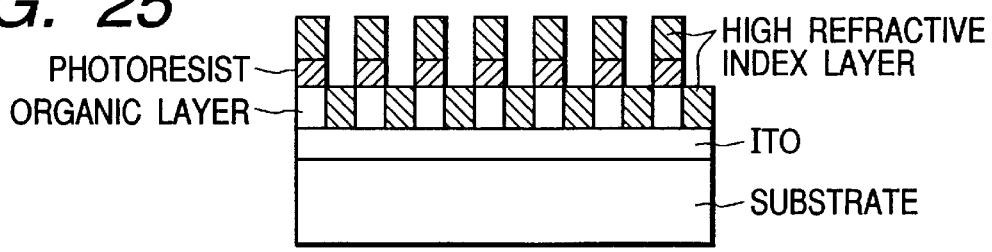

As shown in FIG. 25, layers of high-refractive-index material are deposited on upper surfaces of the photoresist segments and exposed surfaces of the ITO layer. The high-refractive index material is selected from among known transparent materials having relatively high refractive indexes. Spaces between the organic semiconductor portions are fully filled with the high-refractive-index material. Thus, the organic semiconductor portions alternate with the high-refractive-index portions., The organic semiconductor portions and the high-refractive-index portions compose a transparent semiconductor layer 6 (see FIG. 1).

Figure 26:
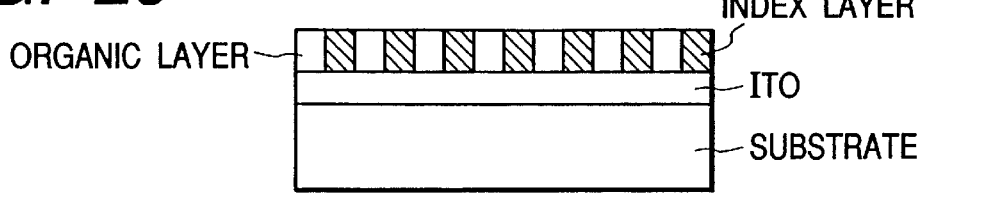
Figure 27:
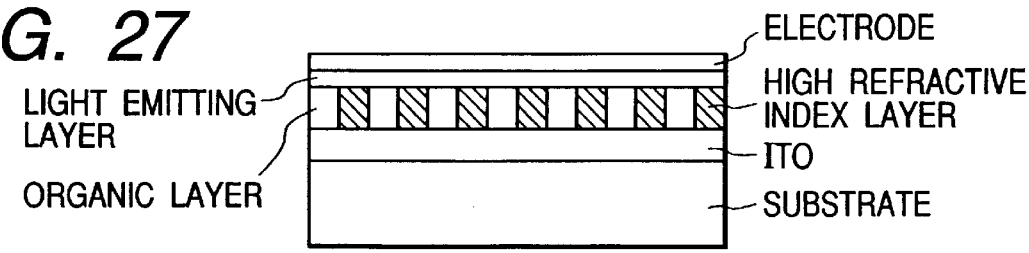

As shown in FIG. 26, the photoresist segments and the high-refractive-index portions thereon are removed. Subsequently, as shown in FIG. 27, an organic light emitting layer and a metal electrode layer are successively formed on upper surfaces of the organic semiconductor portions and the high-refractive-index portions by vapor deposition.

Second Embodiment

Figure 3:
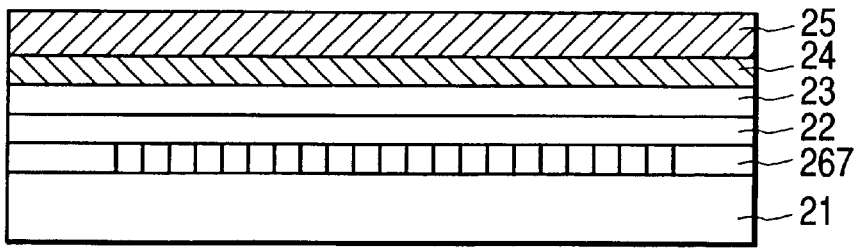
FIG. 3 is a sectional view of an organic light emitter according to a second embodiment of this invention.

FIG. 3 shows an organic light emitter according to a second embodiment of this invention. The organic light emitter of FIG. 3 has a multi-layer structure or a laminated structure as will be made clear later. The organic light emitter of FIG. 3 includes a glass substrate 21 having a flat upper surface. A transparent dielectric layer 267 is formed on the upper surface of the glass substrate 21. In the transparent dielectric layer 267, segments of first dielectric alternate with segments of second dielectric as viewed along a direction parallel to the upper surface of the glass substrate 21. The first dielectric and the second dielectric are different from each other in refractive index. For example, the first dielectric and the second dielectric are titanium oxide and zinc sulfide respectively. A transparent electrode layer 22 is formed on the transparent dielectric layer 267. The transparent electrode layer 22 is made of indium tin oxide (ITO). The transparent electrode layer 22 serves as an anode. A hole transport layer 23 is formed on the transparent electrode layer 22. The hole transport layer 23 is made of triphenyldiamine, TPD [N, N'-bis(3-methylphenyl)-(1,1'-biphenyl)-4,4'-diamine]. An organic light emitting layer 24 is formed on the hole transport layer 23. The organic light emitting layer 24 includes an organic semiconductor made of, for example, Alq [tris (8-hydroxyquinoline)aluminum]. The organic light emitting layer 24 can transport electrons. A metal electrode layer 25 is formed on the organic light emitting layer 24. The metal electrode layer 25 serves as a cathode.

As previously mentioned, the transparent dielectric layer 267 has the alternation of first dielectric segments and second dielectric segments. Therefore, the transparent dielectric layer 267 has a refractive index which spatially and periodically varies in a direction parallel to the planes of the boundaries with the glass substrate 21 and the transparent electrode layer 22, for example, in a left-right or horizontal direction as viewed in FIG. 3. Preferably, the variation of the refractive index of the transparent dielectric layer 267 has a given constant period. The refractive index of the transparent dielectric layer 267 is in a given range higher than the refractive indexes of the glass substrate 21 and the organic light emitting layer 24.

A direct-current power source (not shown) is connected between the transparent electrode layer 22 and the metal electrode layer 25 to apply a driving voltage to the organic light emitter. Holes and electrons are injected into the organic light emitting layer 24 from the anode (the transparent electrode layer 22) and the cathode (the metal electrode layer 25) by the driving voltage. The injected holes and electrons meet, and cause light. In this way, the light is generated in the organic light emitting layer 24. The generated light is propagated from the organic light emitting layer 24 to the transparent dielectric layer 267 through the hole transport layer 23 and the transparent electrode layer 22.

The transparent dielectric layer 267 which has the periodically-varying high refractive index provides the following effect. The generated light is confined in a region between the two low-refractive-index layers, that is, the organic light emitting layer 24 and the glass substrate 21. Specifically, the generated light is confined mainly in the transparent dielectric layer 267. The generated light is propagated in an optical waveguide as a forward light beam along a direction parallel to the upper surface of the glass substrate 21, that is, a direction parallel to the plane of the boundary between the glass substrate 21 and the transparent dielectric layer 267. The optical waveguide includes the transparent dielectric layer 267 in which the refractive index varies at the constant period. The effective refractive index of the optical waveguide spatially and periodically varies in accordance with the spatial periodic variation in the refractive index of the transparent dielectric layer 267. The periodical variation in the effective refractive index of the optical waveguide causes an optical resonator which extends in a direction parallel to the upper surface of the glass substrate 21. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 21 before being emitted to an external via a lower surface of the glass substrate 21.

Third Embodiment

Figure 4:
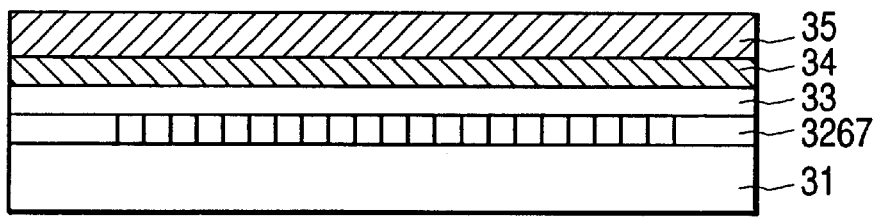
FIG. 4 is a sectional view of an organic light emitter according to a third embodiment of this invention.

FIG. 4 shows an organic light emitter according to a third embodiment of this invention. The organic light emitter of FIG. 4 has a multi-layer structure or a laminated structure as will be made clear later. The organic light emitter of FIG. 4 includes a glass substrate 31 having a flat upper surface. A transparent electrode 3267 is formed on the upper surface of the glass substrate 31. The transparent electrode layer 3267 serves as an anode. A hole transport layer 33 is formed on the transparent electrode layer 3267. The hole transport layer 33 is made of triphenyldiamine, TPD [N,N'-bis(3-methylphenyl)-(1,1'-biphenyl)-4,4'-diamine]. An organic light emitting layer 34 is formed on the hole transport layer 33. The organic light emitting layer 34 includes an organic semiconductor made of, for example, Alq [tris(8-hydroxyquinoline)aluminum]. The organic light emitting layer 34 can transport electrons. A metal electrode layer 35 is formed on the organic light emitting layer 34. The metal electrode layer 35 serves as a cathode.

The transparent electrode layer 3267 is made of indium tin oxide (ITO). The transparent electrode layer 3267 has a composition ratio which spatially and periodically varies as viewed along a direction parallel to the upper surface of the glass substrate 31. Therefore, the refractive index of the transparent electrode layer 3267 spatially and periodically varies in a direction parallel to the planes of the boundaries with the glass substrate 31 and the hole transport layer 33. Preferably, the variation of the refractive index of the transparent electrode layer 3267 has a given constant period. The refractive index of the transparent electrode layer 3267 is in a given range higher than the refractive indexes of the glass substrate 31 and the organic light emitting layer 34.

A direct-current power source (not shown) is connected between the transparent electrode layer 3267 and the metal electrode layer 35 to apply a driving voltage to the organic light emitter. Holes and electrons are injected into the organic light emitting layer 34 from the anode (the transparent electrode layer 3267) and the cathode (the metal electrode layer 35) by the driving voltage. The injected holes and electrons meet, and cause light. In this way, the light is generated in the organic light emitting layer 34. The generated light is propagated from the organic light emitting layer 34 to the transparent electrode layer 3267 through the hole transport layer 33.

The transparent electrode layer 3267 which has the periodically-varying high refractive index provides the following effect. The generated light is confined in a region between the two low-refractive-index layers, that is, the organic light emitting layer 34 and the glass substrate 31. Specifically, the generated light is confined mainly in the transparent electrode layer 3267. The generated light is propagated in an optical waveguide as a forward light beam along a direction parallel to the upper surface of the glass substrate 31, that is, a direction parallel to the plane of the boundary between the glass substrate 31 and the transparent electrode layer 3267. The optical waveguide includes the transparent electrode layer 3267 in which the refractive index varies at the constant period. The effective refractive index of the optical waveguide spatially and periodically varies in accordance with the spatial periodic variation in the refractive index of the transparent electrode layer 3267. The periodical variation in the effective refractive index of the optical waveguide causes an optical resonator which extends in a direction parallel to the upper surface of the glass substrate 31. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 31 before being emitted to an external via a lower surface of the glass substrate 31.

Fourth Embodiment

Figure 5:
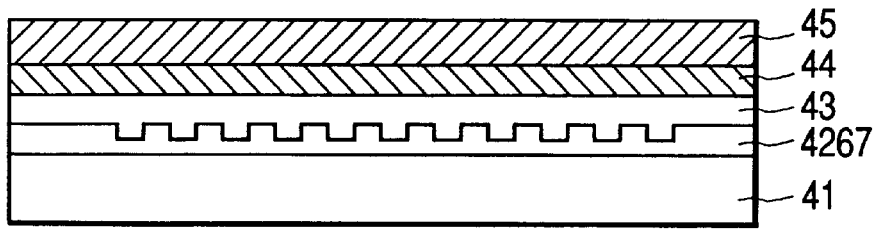
FIG. 5 is a sectional view of an organic light emitter according to a fourth embodiment of this invention.

FIG. 5 shows an organic light emitter according to a fourth embodiment of this invention. The organic light emitter of FIG. 5 has a multi-layer structure or a laminated structure as will be made clear later. The organic light emitter of FIG. 5 includes a glass substrate 41 having a flat upper surface. A transparent electrode 4267 is formed on the upper surface of the glass substrate 41. The transparent electrode layer 4267 serves as an anode. A hole transport layer 43 is formed on the transparent electrode layer 4267. The hole transport layer 43 is made of triphenyldiamine, TPD [N,N'-bis(3-methylphenyl)-(1,1'-biphenyl)-4,4'-diamine]. An organic light emitting layer 44 is formed on the hole transport layer 43. The organic light emitting layer 44 includes an organic semiconductor made of, for example, Alq [tris(8-hydroxyquinoline)aluminum]. The organic light emitting layer 44 can transport electrons. A metal electrode layer 45 is formed on the organic light emitting layer 44. The metal electrode layer 45 serves as a cathode.

The transparent electrode layer 4267 is made of indium tin oxide (ITO). The upper surface of the transparent electrode layer 4267 has grooves and lands which alternate with each other as viewed along a direction parallel to the upper surface of the glass substrate 41. In other words, the upper surface of the transparent electrode layer 4267 is periodically rugged. Therefore, the refractive index of the transparent electrode layer 4267 spatially and periodically varies in a direction parallel to the plane of the boundary with the glass substrate 41. Preferably, the variation of the refractive index of the transparent electrode layer 4267 has a given constant period. The refractive index of the transparent electrode layer 4267 is in a given range higher than the refractive indexes of the glass substrate 41 and the organic light emitting layer 44.

A direct-current power source (not shown) is connected between the transparent electrode layer 4267 and the metal electrode layer 45 to apply a driving voltage to the organic light emitter. Holes and electrons are injected into the organic light emitting layer 44 from the anode (the transparent electrode layer 4267) and the cathode (the metal electrode layer 45) by the driving voltage. The injected holes and electrons meet, and cause light. In this way, the light is generated in the organic light emitting layer 44. The generated light is propagated from the organic light emitting layer 44 to the transparent electrode layer 4267 through the hole transport layer 43.

The transparent electrode layer 4267 which has the periodically-varying high refractive index provides the following effect. The generated light is confined in a region between the two low-refractive-index layers, that is, the organic light emitting layer 44 and the glass substrate 41. Specifically, the generated light is confined mainly in the transparent electrode layer 4267. The generated light is propagated in an optical waveguide as a forward light beam along a direction parallel to the upper surface of the glass substrate 41, that is, a direction parallel to the plane of the boundary between the glass substrate 41 and the transparent electrode layer 4267. The optical waveguide includes the transparent electrode layer 4267 in which the refractive index varies at the constant period. The effective refractive index of the optical waveguide spatially and periodically varies in accordance with the spatial periodic variation in the refractive index of the transparent electrode layer 4267. The periodical variation in the effective refractive index of the optical waveguide causes an optical resonator which extends in a direction parallel to the upper surface of the glass substrate 41. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 41 before being emitted to an external via a lower surface of the glass substrate 41.

Figure 28:
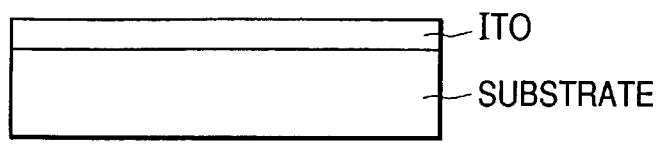
FIGS. 28–33 are sectional views of a glass substrate and layers thereon which relate to different stages during the fabrication of the organic light emitter in FIG. 5.

The organic light emitter of FIG. 5 is fabricated as follows. With reference to FIG. 28, a glass substrate is prepared, and then an ITO (indium tin oxide) layer is formed on the glass substrate by vapor deposition or sputtering.

Photoresist is applied onto the ITO layer by spin coating. As a result, a layer of photoresist is formed on the ITO layer.

Figure 29:
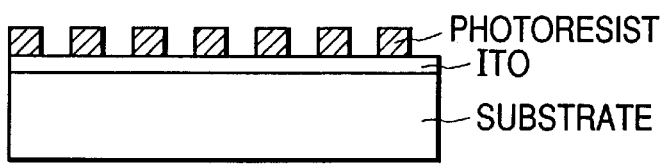

As shown in FIG. 29, the photoresist layer is made into a given shape by a patterning process using a mask. The resultant photoresist layer has segments spaced at equal intervals as viewed in a horizontal direction. As a result of the patterning process, portions of the ITO layer are exposed. The combination of the layers and the glass substrate is subjected to a dry etching process so that portions of the ITO layer which are uncovered from the photoresist segments are partially removed.

Figure 30:
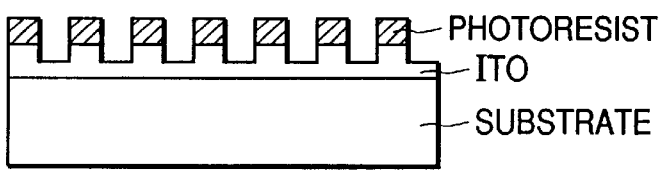
Figure 31:
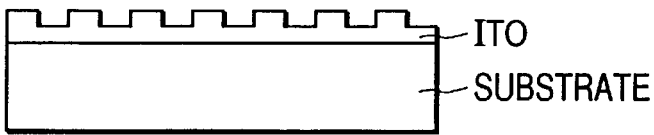

As shown in FIG. 30, the ITO layer has grooves which are spaced at equal intervals as viewed along a horizontal direction. Subsequently, as shown in FIG. 31, the photoresist segments are removed.

Figure 32:
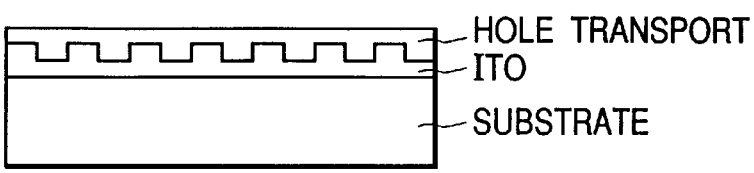
Figure 33:
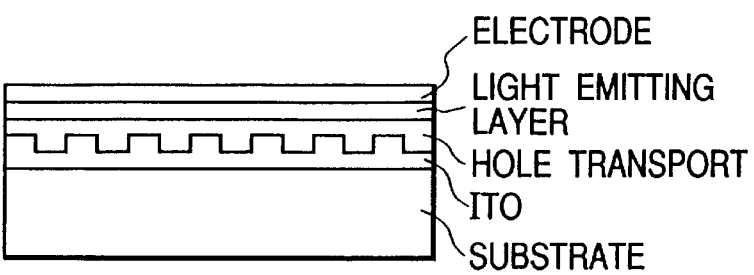

As shown in FIG. 32, a hole transport layer is formed on the ITO layer by vapor deposition. Then, as shown in FIG. 33, an organic light emitting layer and a metal electrode layer are successively formed on the hole transport layer.

Fifth Embodiment

Figure 6:
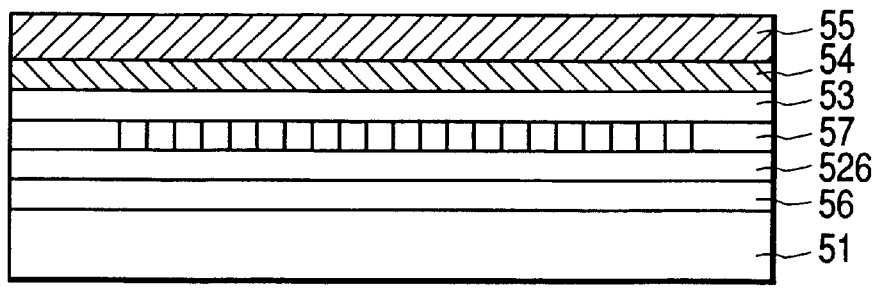
FIG. 6 is a sectional view of an organic light emitter according to a fifth embodiment of this invention.

FIG. 6 shows an organic light emitter according to a fifth embodiment of this invention. The organic light emitter of FIG. 6 has a multi-layer structure or a laminated structure as will be made clear later. The organic light emitter of FIG. 6 includes a glass substrate 51 having a flat upper surface. A dielectric layer 56 is formed on the upper surface of the glass substrate 51. Preferably, the dielectric layer 56 is transparent. A transparent electrode layer 52 is formed on the dielectric layer 56. The transparent electrode layer 52 is made of indium tin oxide (ITO). The transparent electrode layer 52 serves as an anode. A hole injection layer 57 is formed on the transparent electrode layer 52. A hole transport layer 53 is formed on the hole injection layer 57. The hole transport layer 53 is made of triphenyldiamine, TPD [N,N'-bis(3-methylphenyl)-(1,1'-biphenyl)-4,4'-diamine]. An organic light emitting layer 54 is formed on the hole transport layer 53. The organic light emitting layer 54 includes an organic semiconductor made of, for example, Alq [tris(8-hydroxyquinoline)aluminum]. The organic light emitting layer 54 can transport electrons. A metal electrode layer 55 is formed on the organic light emitting layer 54. The metal electrode layer 55 serves as a cathode.

The dielectric layer 56 has a refractive index which is higher than the refractive indexes of the glass substrate 51 and the organic light emitting layer 54. The hole injection layer 57 has a refractive index which spatially and periodically varies in a direction parallel to the planes of the boundaries with the transparent electrode layer 52 and the hole transport layer 53, for example, in a left-right or horizontal direction as viewed in FIG. 6. Preferably, the variation of the refractive index of the hole injection layer 57 has a given constant period. Preferably, the refractive index of the hole injection layer 57 is in a given range higher than the refractive indexes of the glass substrate 51 and the organic light emitting layer 54.

A direct-current power source (not shown) is connected between the transparent electrode layer 52 and the metal electrode layer 55 to apply a driving voltage to the organic light emitter. Holes and electrons are injected into the organic light emitting layer 54 from the anode (the transparent electrode layer 52) and the cathode (the metal electrode layer 55) by the driving voltage. The injected holes and electrons meet, and cause light. In this way, the light is generated in the organic light emitting layer 54. The generated light is propagated from the organic light emitting layer 54 to the hole injection layer 57 and the transparent electrode layer 52 through the hole transport layer 53.

The dielectric layer 56 which has the high refractive index provides the following effect. The generated light is confined in a region between the two low-refractive-index layers, that is, the organic light emitting layer 54 and the glass substrate 51. Specifically, the generated light is confined mainly in the hole injection layer 57 and the transparent electrode layer 52. The generated light is propagated in an optical waveguide as a forward light beam along a direction parallel to the upper surface of the glass substrate 51, that is, a direction parallel to the plane of the boundary between the glass substrate 51 and the dielectric layer 56. The optical waveguide includes the hole injection layer 57 in which the refractive index varies at the constant period. The effective refractive index of the optical waveguide spatially and periodically varies in accordance with the spatial periodic variation in the refractive index of the hole injection layer 57. The periodical variation in the effective refractive index of the optical waveguide causes an optical resonator which extends in a direction parallel to the upper surface of the glass substrate 51. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 51 before being emitted to an external via a lower surface of the glass substrate 51.

Sixth Embodiment

Figure 7:
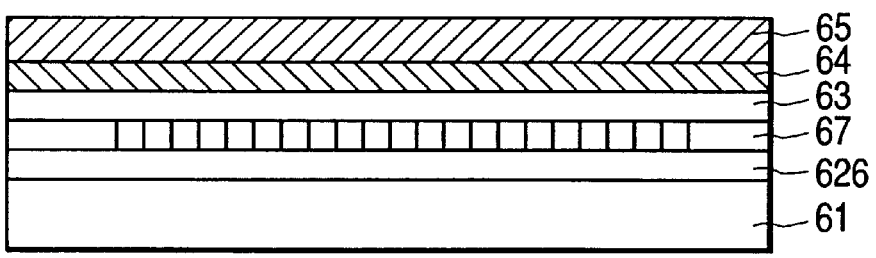
FIG. 7 is a sectional view of an organic light emitter according to a sixth embodiment of this invention.

FIG. 7 shows an organic light emitter according to a sixth embodiment of this invention. The organic light emitter of FIG. 7 has a multi-layer structure or a laminated structure as will be made clear later. The organic light emitter of FIG. 7 includes a glass substrate 61 having a flat upper surface. A transparent electrode layer 626 is formed on the upper surface of the glass substrate 61. The transparent electrode layer 626 is made of indium tin oxide (ITO). The transparent electrode layer 626 serves as an anode. A hole injection layer 67 is formed on the transparent electrode layer 626. A hole transport layer 63 is formed on the hole injection layer 67. The hole transport layer 63 is made of triphenyldiamine, TPD [N,N'-bis(3-methylphenyl)-(1,1'-biphenyl)-4,4'-diamine]. An organic light emitting layer 64 is formed on the hole transport layer 63. The organic light emitting layer 64 includes an organic semiconductor made of, for example, Alq [tris(8-hydroxyquinoline)aluminum]. The organic light emitting layer 64 can transport electrons. A metal electrode layer 65 is formed on the organic light emitting layer 64. The metal electrode layer 65 serves as a cathode.

The transparent electrode layer 626 has a refractive index which is higher than the refractive indexes of the glass substrate 61 and the organic light emitting layer 64. The hole injection layer 67 has a refractive index which spatially and periodically varies in a direction parallel to the planes of the boundaries with the transparent electrode layer 626 and the hole transport layer 63, for example, in a left-right or horizontal direction as viewed in FIG. 7. Preferably, the variation of the refractive index of the hole injection layer 67 has a given constant period. Preferably, the refractive index of the hole injection layer 67 is in a given range higher than the refractive indexes of the glass substrate 61 and the organic light emitting layer 64.

A direct-current power source (not shown) is connected between the transparent electrode layer 626 and the metal electrode layer 65 to apply a driving voltage to the organic light emitter. Holes and electrons are injected into the organic light emitting layer 64 from the anode (the transparent electrode layer 626) and the cathode (the metal electrode layer 65) by the driving voltage. The injected holes and electrons meet, and cause light. In this way, the light is generated in the organic light emitting layer 64. The generated light is propagated from the organic light emitting layer 64 to the hole injection layer 67 and the transparent electrode layer 626 through the hole transport layer 63.

The transparent electrode layer 626 which has the high refractive index provides the following effect. The generated light is confined in a region between the two low-refractive-index layers, that is, the organic light emitting layer 64 and the glass substrate 61. Specifically, the generated light is confined mainly in the hole injection layer 67 and the transparent electrode layer 626. The generated light is propagated in an optical waveguide as a forward light beam along a direction parallel to the upper surface of the glass substrate 61, that is, a direction parallel to the plane of the boundary between the glass substrate 61 and the transparent electrode layer 626. The optical waveguide includes the hole injection layer 67 in which the refractive index varies at the constant period. The effective refractive index of the optical waveguide spatially and periodically varies in accordance with the spatial periodic variation in the refractive index of the hole injection layer 67. The periodical variation in the effective refractive index of the optical waveguide causes an optical resonator which extends in a direction parallel to the upper surface of the glass substrate 61. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 61 before being emitted to an external via a lower surface of the glass substrate 61.

Seventh Embodiment

Figure 8:
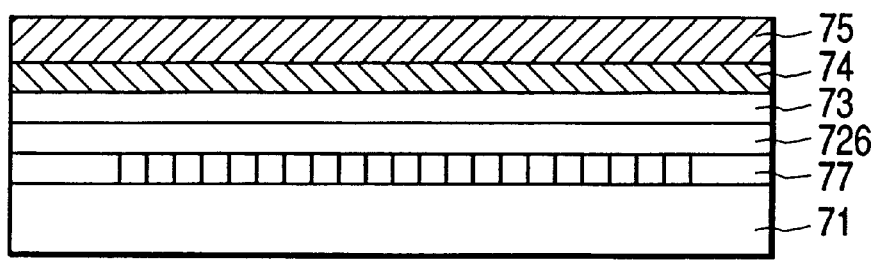
FIG. 8 is a sectional view of an organic light emitter according to a seventh embodiment of this invention.

FIG. 8 shows an organic light emitter according to a seventh embodiment of this invention. The organic light emitter of FIG. 8 has a multi-layer structure or a laminated structure as will be made clear later. The organic light emitter of FIG. 8 includes a glass substrate 71 having a flat upper surface. A dielectric layer 77 is formed on the upper surface of the glass substrate 51. Preferably, the dielectric layer 77 is transparent. In the dielectric layer 77, segments of first dielectric alternate with segments of second dielectric as viewed along a direction parallel to the upper surface of the glass substrate 71. The first dielectric and the second dielectric are different from each other in refractive index. For example, the first dielectric and the second dielectric are silicon oxide and titanium oxide respectively. A transparent electrode layer 726 is formed on the dielectric layer 77. The transparent electrode layer 726 is made of indium tin oxide (ITO). The transparent electrode layer 726 serves as an anode. A hole transport layer 73 is formed on the transparent electrode layer 726. The hole transport layer 73 is made of triphenyldiamine, TPD [N,N'-bis(3-methylphenyl)-(1,1'-biphenyl)-4,4'-diamine]. An organic light emitting layer 74 is formed on the hole transport layer 73. The organic light emitting layer 74 includes an organic semiconductor made of, for example, Alq [tris(8-hydroxyquinoline)aluminum]. The organic light emitting layer 74 can transport electrons. A metal electrode layer 75 is formed on the organic light emitting layer 74. The metal electrode layer 75 serves as a cathode.

As previously mentioned, the dielectric layer 77 has the alternation of first dielectric segments and second dielectric segments. Therefore, the dielectric layer 77 has a refractive index which spatially and periodically varies in a direction parallel to the planes of the boundaries with the glass substrate 71 and the transparent electrode layer 726, for example, in a left-right or horizontal direction as viewed in FIG. 8. Preferably, the variation of the refractive index of the dielectric layer 77 has a given constant period. The refractive index of the dielectric layer 77 is in a given range higher than the refractive indexes of the glass substrate 71 and the organic light emitting layer 74. Preferably, the refractive index of the transparent electrode layer 726 is higher than the refractive indexes of the glass substrate 71 and the organic light emitting layer 74.

A direct-current power source (not shown) is connected between the transparent electrode layer 726 and the metal electrode layer 75 to apply a driving voltage to the organic light emitter. Holes and electrons are injected into the organic light emitting layer 74 from the anode (the transparent electrode layer 726) and the cathode (the metal electrode layer 75) by the driving voltage. The injected holes and electrons meet, and cause light. In this way, the light is generated in the organic light emitting layer 74. The generated light is propagated from the organic light emitting layer 74 to the transparent electrode layer 726 and the dielectric layer 77 through the hole transport layer 73.

The transparent electrode layer 726 and the dielectric layer 77 which have the high refractive indexes provide the following effect. The generated light is confined in a region between the two low-refractive-index layers, that is, the organic light emitting layer 74 and the glass substrate 71. Specifically, the generated light is confined mainly in the transparent electrode layer 726 and the dielectric layer 77. The generated light is propagated in an optical waveguide as a forward light beam along a direction parallel to the upper surface of the glass substrate 71, that is, a direction parallel to the plane of the boundary between the glass substrate 71 and the dielectric layer 77. The optical waveguide includes the dielectric layer 77 in which the refractive index varies at the constant period. The effective refractive index of the optical waveguide spatially and periodically varies in accordance with the spatial periodic variation in the refractive index of the dielectric layer 77. The periodical variation in the effective refractive index of the optical waveguide causes an optical resonator which extends in a direction parallel to the upper surface of the glass substrate 71. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 71 before being emitted to an external via a lower surface of the glass substrate 71.

Eighth Embodiment

Figure 9:
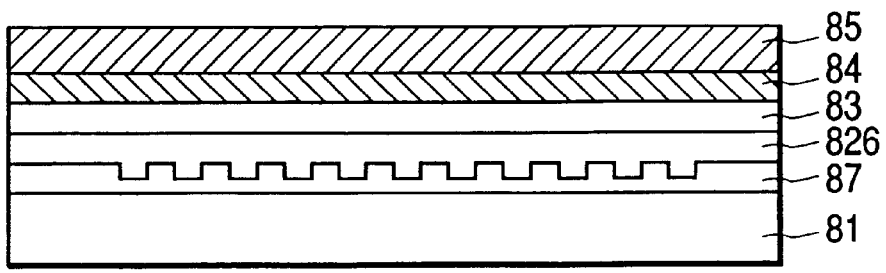
FIG. 9 is a sectional view of an organic light emitter according to an eighth embodiment of this invention.

FIG. 9 shows an organic light emitter according to an eighth embodiment of this invention. The organic light emitter of FIG. 9 has a multi-layer structure or a laminated structure as will be made clear later. The organic light emitter of FIG. 9 includes a glass substrate 81 having a flat upper surface. A dielectric layer 87 is formed on the upper surface of the glass substrate 81. Preferably, the dielectric layer 87 is transparent. A transparent electrode layer 826 is formed on the dielectric layer 87. The transparent electrode layer 826 is made of indium tin oxide (ITO). The transparent electrode layer 826 serves as an anode. A hole transport layer 83 is formed on the transparent electrode layer 826. The hole transport layer 83 is made of triphenyldiamine, TPD [N,N'-bis(3-methylphenyl)-(1,1'-biphenyl)-4,4'-diamine]. An organic light emitting layer 84 is formed on the hole transport layer 83. The organic light emitting layer 84 includes an organic semiconductor made of, for example, Alq [tris(8-hydroxyquinoline)aluminum]. The organic light emitting layer 84 can transport electrons. A metal electrode layer 85 is formed on the organic light emitting layer 84. The metal electrode layer 85 serves as a cathode.

The upper surface of the dielectric layer 87 has grooves and lands which alternate with each other as viewed along a direction parallel to the upper surface of the glass substrate 81. In other words, the upper surface of the dielectric layer 87 is periodically rugged. Therefore, the refractive index of the dielectric layer 87 spatially and periodically varies in a direction parallel to the plane of the boundary between the dielectric layer 87 and the glass substrate 81. Preferably, the variation of the refractive index of the dielectric layer 87 has a given constant period. For example, the refractive index of the dielectric layer 87 is in a given range higher than the refractive indexes of the glass substrate 81 and the organic light emitting layer 84. Preferably, the refractive index of the transparent electrode layer 826 is higher than the refractive indexes of the glass substrate 81 and the organic light emitting layer 84.

A direct-current power source (not shown) is connected between the transparent electrode layer 826 and the metal electrode layer 85 to apply a driving voltage to the organic light emitter. Holes and electrons are injected into the organic light emitting layer 84 from the anode (the transparent electrode layer 826) and the cathode (the metal electrode layer 85) by the driving voltage. The injected holes and electrons meet, and cause light. In this way, the light is generated in the organic light emitting layer 84. The generated light is propagated from the organic light emitting layer 84 to the transparent electrode layer 826 and the dielectric layer 87 through the hole transport layer 83.

The transparent electrode layer 826 and the dielectric layer 87 which have the high refractive indexes provide the following effect. The generated light is confined in a region between the two low-refractive-index layers, that is, the organic light emitting layer 84 and the glass substrate 81. Specifically, the generated light is confined mainly in the transparent electrode layer 826 and the dielectric layer 87. The generated light is propagated in an optical waveguide as a forward light beam along a direction parallel to the upper surface of the glass substrate 81, that is, a direction parallel to the plane of the boundary between the glass substrate 81 and the dielectric layer 87. The optical waveguide includes the dielectric layer 87 in which the refractive index varies at the constant period. The effective refractive index of the optical waveguide spatially and periodically varies in accordance with the spatial periodic variation in the refractive index of the dielectric layer 87. The periodical variation in the effective refractive index of the optical waveguide causes an optical resonator which extends in a direction parallel to the upper surface of the glass substrate 81. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 81 before being emitted to an external via a lower surface of the glass substrate 81.

Ninth Embodiment

Figure 10:
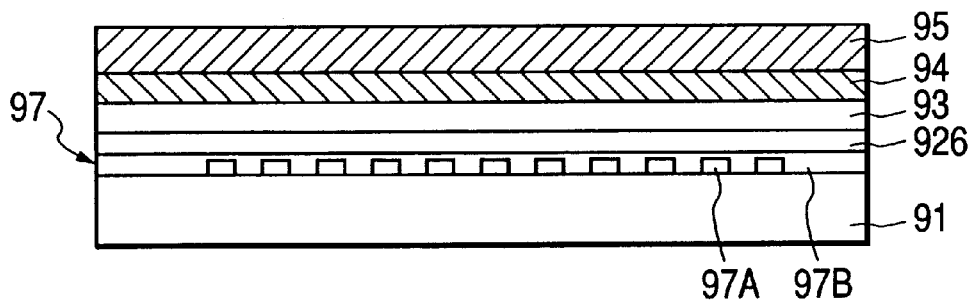
FIG. 10 is a sectional view of an organic light emitter according to a ninth embodiment of this invention.

FIG. 10 shows an organic light emitter according to a ninth embodiment of this invention. The organic light emitter of FIG. 10 has a multi-layer structure or a laminated structure as will be made clear later. The organic light emitter of FIG. 10 includes a glass substrate 91 having a flat upper surface. A composite dielectric layer 97 is formed on the upper surface of the glass substrate 91. Preferably, the composite dielectric layer 97 is transparent. A transparent electrode layer 926 is formed on the composite dielectric layer 97. The transparent electrode layer 926 is made of indium tin oxide (ITO). The transparent electrode layer 926 serves as an anode. A hole transport layer 93 is formed on the transparent electrode layer 926. The hole transport layer 93 is made of triphenyldiamine, TPD [N,N'-bis(3-methylphenyl)-(1,1'-biphenyl)-4,4'-diamine]. An organic light emitting layer 94 is formed on the hole transport layer 93. The organic light emitting layer 94 includes an organic semiconductor made of, for example, Alq [tris(8-hydroxyquinoline)aluminum]. The organic light emitting layer 94 can transport electrons. A metal electrode layer 95 is formed on the organic light emitting layer 94. The metal electrode layer 95 serves as a cathode.

The composite dielectric layer 97 includes a stripe array of parallel linear segments 97A formed on the upper surface of the glass substrate 91. The linear segments 97A are made of first dielectric. The linear segments 97A are spaced from each other at equal intervals as viewed in a direction parallel to the upper surface of the glass substrate 91, for example, in a left-right or horizontal direction of FIG. 10. The linear segments 97A and portions of the upper surface of the glass substrate 91 which are uncovered from the linear segments 97A are coated with a layer 97B of second dielectric. The second dielectric has a refractive index different from that of the first dielectric. Accordingly, the refractive index of the composite dielectric layer 97 spatially and periodically varies in a direction parallel to the plane of the boundary between the composite dielectric layer 97 and the glass substrate 91. Preferably, the variation of the refractive index of the composite dielectric layer 97 has a given constant period. For example, the refractive index of the composite dielectric layer 97 is in a given range higher than the refractive indexes of the glass substrate 91 and the organic light emitting layer 94. Preferably, the refractive index of the transparent electrode layer 926 is higher than the refractive indexes of the glass substrate 91 and the organic light emitting layer 94.

A direct-current power source (not shown) is connected between the transparent electrode layer 926 and the metal electrode layer 95 to apply a driving voltage to the organic light emitter. Holes and electrons are injected into the organic light emitting layer 94 from the anode (the transparent electrode layer 926) and the cathode (the metal electrode layer 95) by the driving voltage. The injected holes and electrons meet, and cause light. In this way, the light is generated in the organic light emitting layer 94. The generated light is propagated from the organic light emitting layer 94 to the transparent electrode layer 926 and the composite dielectric layer 97 through the hole transport layer 93.

The transparent electrode layer 926 and the composite dielectric layer 97 which have the high refractive indexes provide the following effect. The generated light is confined in a region between the two low-refractive-index layers, that is, the organic light emitting layer 94 and the glass substrate 91. Specifically, the generated light is confined mainly in the transparent electrode layer 926 and the composite dielectric layer 97. The generated light is propagated in an optical waveguide as a forward light beam along a direction parallel to the upper surface of the glass substrate 91, that is, a direction parallel to the plane of the boundary between the glass substrate 91 and the composite dielectric layer 97. The optical waveguide includes the composite dielectric layer 97 in which the refractive index varies at the constant period. The effective refractive index of the optical waveguide spatially and periodically varies in accordance with the spatial periodic variation in the refractive index of the composite dielectric layer 97. The periodical variation in the effective refractive index of the optical waveguide causes an optical resonator which extends in a direction parallel to the upper surface of the glass substrate 91. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 91 before being emitted to an external via a lower surface of the glass substrate 91.

Tenth Embodiment

Figure 11:
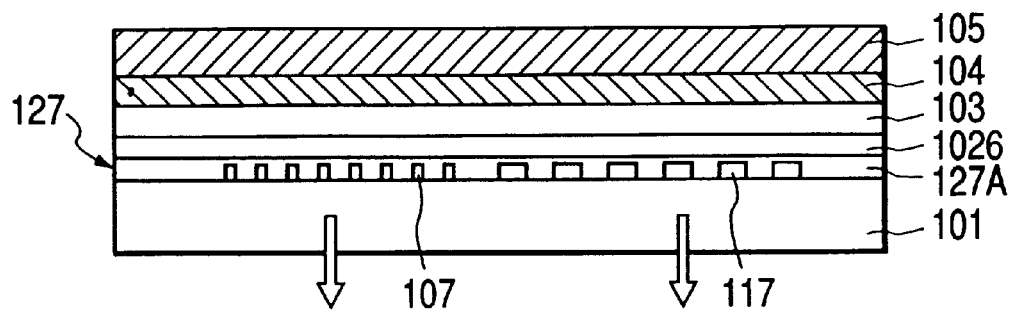
FIG. 11 is a sectional view of an organic light emitter according to a tenth embodiment of this invention.

FIG. 11 shows an organic light emitter according to a tenth embodiment of this invention. The organic light emitter of FIG. 11 has a multi-layer structure or a laminated structure as will be made clear later. The organic light emitter of FIG. 11 includes a glass substrate 101 having a flat upper surface. A composite dielectric layer 127 is formed on the upper surface of the glass substrate 101. Preferably, the composite dielectric layer 127 is transparent. A transparent electrode layer 1026 is formed on the composite dielectric layer 127. The transparent electrode layer 1026 is made of indium tin oxide (ITO). The transparent electrode layer 1026 serves as an anode. A hole transport layer 103 is formed on the transparent electrode layer 1026. The hole transport layer 103 is made of triphenyldiamine, TPD [N,N'-bis(3-methylphenyl)-(1,1'-biphenyl)-4,4'-diamine]. An organic light emitting layer 104 is formed on the hole transport layer 103. The organic light emitting layer 104 includes an organic semiconductor made of, for example, Alq [tris(8-hydroxyquinoline)aluminum]. The organic light emitting layer 104 can transport electrons. A metal electrode layer 105 is formed on the organic light emitting layer 104. The metal electrode layer 105 serves as a cathode.

The composite dielectric layer 127 has a first effective area and a second effective area spaced from each other as viewed in a direction parallel to the upper surface of the glass substrate 101. The first effective area of the composite dielectric layer 127 includes a stripe array of first parallel linear segments 107 formed on the upper surface of the glass substrate 101. The first linear segments 107 are made of first dielectric. The first linear segments 107 are spaced from each other at equal intervals as viewed in a direction parallel to the upper surface of the glass substrate 101, for example, in a left-right or horizontal direction of FIG. 11. The second effective area of the composite dielectric layer 127 includes a stripe array of second parallel linear segments 117 formed on the upper surface of the glass substrate 101. The second linear segments 117 are made of the first dielectric. The second linear segments 117 are spaced from each other at equal intervals as viewed in a direction parallel to the upper surface of the glass substrate 101, for example, in a left-right or horizontal direction of FIG. 11. The intervals between the second linear segments 117 differ from the intervals between the first linear segments 107. The first linear segments 107, the second linear segments 117, and portions of the upper surface of the glass substrate 101 which are uncovered from the linear segments 107 and 117 are coated with a layer 127A of second dielectric. The second dielectric has a refractive index different from that of the first dielectric. Accordingly, the refractive index of the composite dielectric layer 127 spatially and periodically varies in a direction parallel to the plane of the boundary between the composite dielectric layer 127 and the glass substrate 101. The variation of the refractive index of the composite dielectric layer 127 in the first effective area has a first given constant period. The variation of the refractive index of the composite dielectric layer 127 in the second effective area has a second given constant period different from the first given constant period. For example, the refractive index of the composite dielectric layer 127 is in a given range higher than the refractive indexes of the glass substrate 101 and the organic light emitting layer 104. Preferably, the refractive index of the transparent electrode layer 1026 is higher than the refractive indexes of the glass substrate 101 and the organic light emitting layer 104.

A direct-current power source (not shown) is connected between the transparent electrode layer 1026 and the metal electrode layer 105 to apply a driving voltage to the organic light emitter. Holes and electrons are injected into the organic light emitting layer 104 from the anode (the transparent electrode layer 1026) and the cathode (the metal electrode layer 105) by the driving voltage. The injected holes and electrons meet, and cause light. In this way, the light is generated in the organic light emitting layer 104. The generated light is propagated from the organic light emitting layer 104 to the transparent electrode layer 1026 and the composite dielectric layer 127 through the hole transport layer 103.

The transparent electrode layer 1026 and the composite dielectric layer 127 which have the high refractive indexes provide the following effect. The generated light is confined in a region between the two low-refractive-index layers, that is, the organic light emitting layer 104 and the glass substrate 101. Specifically, the generated light is confined mainly in the transparent electrode layer 1026 and the composite dielectric layer 127. The generated light is propagated in an optical waveguide as a forward light beam along a direction parallel to the upper surface of the glass substrate 101, that is, a direction parallel to the plane of the boundary between the glass substrate 101 and the composite dielectric layer 127. The optical waveguide includes the first effective area of the composite dielectric layer 127 in which the refractive index varies at the first constant period, and the second effective area of the composite dielectric layer 127 in which the refractive index varies at the second constant period. The effective refractive index of the optical waveguide spatially and periodically varies in accordance with the spatial periodic variation in the refractive index of the composite dielectric layer 127.

In a region corresponding to the first effective area of the composite dielectric layer 127, the periodical variation in the effective refractive index of the optical waveguide causes a first optical resonator which extends in a direction parallel to the upper surface of the glass substrate 101. The first optical resonator selects a component of the generated light beam which has a first given wavelength corresponding to the resonance frequency thereof. Thus, in a spectrum domain (a wavelength domain), the resultant light has great intensities at and around the first given wavelength determined by the first optical resonator. In the region corresponding to the first effective area of the composite dielectric layer 127, the resultant light is scattered in the optical waveguide, moving out of the optical waveguide and then passing through the glass substrate 101 before being emitted to an external via a lower surface of the glass substrate 101.

In a region corresponding to the second effective area of the composite dielectric layer 127, the periodical variation in the effective refractive index of the optical waveguide causes a second optical resonator which extends in a direction parallel to the upper surface of the glass substrate 101. The second optical resonator differs from the first optical resonator in resonance frequency. The second optical resonator selects a component of the generated light beam which has a second given wavelength corresponding to the resonance frequency thereof. The second given wavelength differs from the first given wavelength. Thus, in a spectrum domain (a wavelength domain), the resultant light has great intensities at and around the second given wavelength determined by the second optical resonator. In the region corresponding to the second effective area of the composite dielectric layer 127, the resultant light is scattered in the optical waveguide, moving out of the optical waveguide and then passing through the glass substrate 101 before being emitted to an external via a lower surface of the glass substrate 101.

The organic light emitter of FIG. 11 may be modified into a structure having three different optical resonators formed by three separate areas of a composite dielectric layer in which its refractive index varies at three different periods. Preferably, the optical resonators are tuned to red light, green light, and blue light respectively.

Eleventh Embodiment

Figure 12:
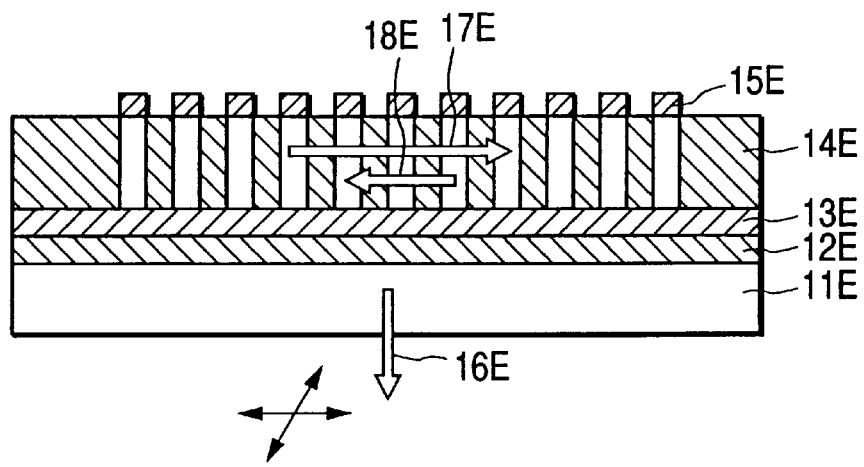
FIG. 12 is a sectional view of an organic light emitter according to an eleventh embodiment of this invention.

FIG. 12 shows an organic light emitter according to an eleventh embodiment of this invention. The organic light emitter of FIG. 12 has a multi-layer structure or a laminated structure as will be made clear later. The organic light emitter of FIG. 12 includes a glass substrate 11E having a flat upper surface. A dielectric layer 12E is formed on the upper surface of the glass substrate 11E. Preferably, the dielectric layer 12E is transparent. A transparent electrode layer 13E is formed on the dielectric layer 12E. The transparent electrode layer 13E is made of, for example, indium tin oxide (ITO). An organic semiconductor layer 14E is formed on the transparent electrode layer 13E. The organic semiconductor layer 14E includes an active layer, that is, a light emitting layer. An array of metal electrodes 1SE is formed on the organic semiconductor layer 14E. The metal electrodes 15E are spaced from each other at equal intervals as viewed in a direction parallel to the upper surface of the organic semiconductor layer 14E, for example, in a left-right or horizontal direction of FIG. 12. Thus, the metal electrodes 15E compose a structure which is spatially periodic along a direction parallel to the upper surface of the organic semiconductor layer 14E. The spatial period of this structure is equal to a given constant value.

Figure 13:
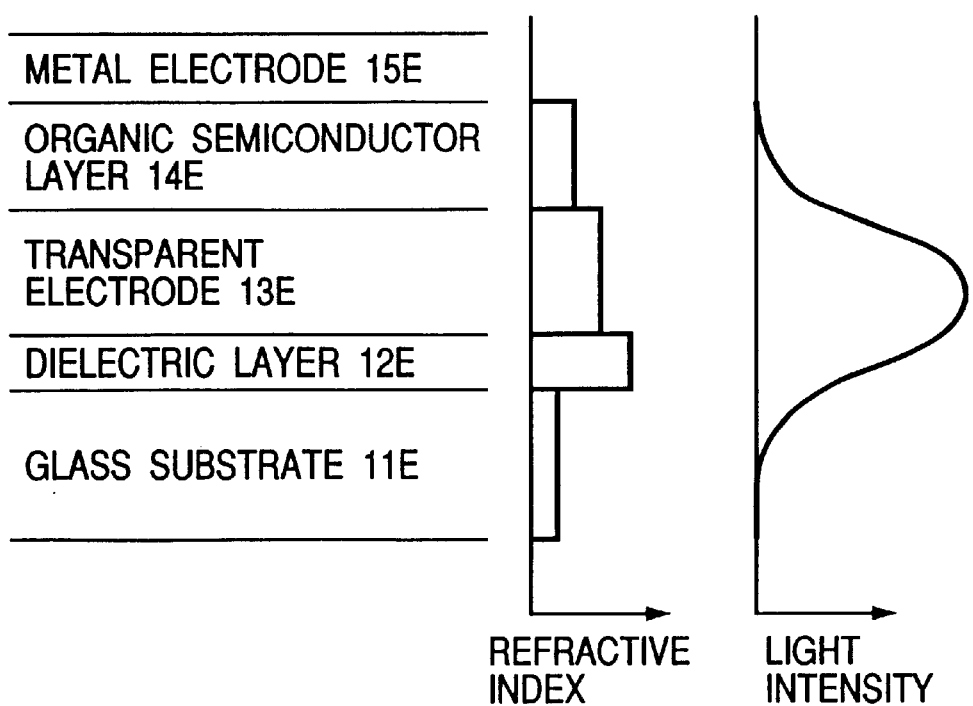
FIG. 13 is a diagram of the refractive indexes of members and the intensity of generated light in the organic light emitter of FIG. 12.

As shown in FIG. 13, the dielectric layer 12E has a given refractive index which is higher than the refractive indexes of the glass substrate 11E and the organic semiconductor layer 14E. Also, the transparent electrode layer 13E has a given refractive index which is higher than the refractive indexes of the glass substrate 11E and the organic semiconductor layer 14E. The refractive index of the dielectric layer 12E is higher than the refractive index of the transparent electrode layer 13E.

An electric power source (not shown), for example, a direct-current power source, is connected between the transparent electrode layer 13E and the array of the metal electrodes 15E to apply a driving voltage to the organic light emitter. Carriers are injected into the light emitting layer within the organic semiconductor layer 14E from the transparent electrode layer 13E and the array of the metal electrodes 15E by the driving voltage. The injected carriers cause light. In this way, the light is generated in the light emitting layer within the organic semiconductor layer 14E. The generated light is propagated from the organic semiconductor layer 14E to the transparent electrode layer 13E and the dielectric layer 12E.

The dielectric layer 12E which is high in refractive index provides the following effect. As shown in FIG. 13, the generated light is confined in a region between the two low-refractive-index layers, that is, the organic semiconductor layer 14E and the glass substrate 11E. Specifically, the generated light is confined mainly in the dielectric layer 12E. The generated light is propagated in an optical waveguide as a forward light beam 17E (see FIG. 12) along a direction parallel to the upper surface of the glass substrate 1 1E, that is, a direction parallel to the plane of the boundary between the glass substrate 11E and the dielectric layer 12E.

A current flowing in the light emitting layer within the organic semiconductor layer 14E has a distribution (a density distribution) which is spatially periodic in accordance with the periodic structure of the metal electrodes 15E. The spatially periodic distribution of the current causes a spatially periodic variation in the intensity of the generated light. The spatial periodic variation in the intensity of the light in the optical waveguide is defined along a direction parallel to the upper surface of the glass substrate 11E. Thus, the optical waveguide has a spatially periodic variation in complex index of refraction. The spatial period of the variation in the complex index of refraction is equal to a given constant value. A component of the forward light beam 17E which as a wavelength tuning to the spatial period of the variation in the complex index of refraction of the optical waveguide is reflected by diffraction, thereby forming a backward light beam 18E (see FIG. 12). The direction of the travel of the backward light beam 18E is opposite to the direction of the travel of the forward light beam 17E. The backward light beam 18E interferes with the component of the forward light beam 17E which has the same wavelength as that of the backward light beam 18E. The interference causes a greater resultant light beam having a specified wavelength corresponding to the wavelength of the backward light beam 18E. In other words, there is provided an optical resonator which extends in a direction parallel to the upper surface of the glass substrate 11E. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 11E before being emitted to an external via a lower surface of the glass substrate 11E.

In the case where the optical length corresponding to the period of the variation in the effective refractive index of the optical waveguide is substantially equal to the wavelength of the generated light, a 2-order diffraction light beam 16E (see FIG. 12) is selected by the optical resonator and is emitted outward via the lower surface of the glass substrate 11E along a direction perpendicular to the lower surface of the glass substrate 11E.

The optical resonator provides a high color purity or a high monochromatism of the emitted light beam. In the case where three organic light emitters of this embodiment are prepared and optical resonators therein are tuned to a red region, a green region, and a blue region respectively, it is possible to provide a multi-color light beam having a high color quality.

The optical waveguide effectively diffracts only components of the generated light which have vibration displacement directions parallel to a direction of a structure of the spatial periodic variation in the refractive index. Accordingly, an outgoing light beam emitted from the optical waveguide toward an external is mainly polarized in a direction corresponding to the structure of the spatially periodic variation in the refractive index. Thus, the polarization direction of the outgoing light beam is determined by the direction in which the structure of the spatially periodic variation in the refractive index is formed.

The refractive index of the dielectric layer 12E may be lower than that of the transparent electrode layer 13E. Preferably, the refractive index of the transparent electrode layer 13E is higher than that of the light emitting layer within the organic semiconductor layer 14E. In this case, the optical waveguide is formed mainly by the transparent electrode layer 13E. Accordingly, provided that a current flowing in the organic semiconductor layer 14E has a spatially periodic distribution (a spatially periodic density distribution), there are an optical waveguide having a structure of a spatially periodic variation in complex index of refraction and also an optical resonator with an optical waveguide.

Figure 34:
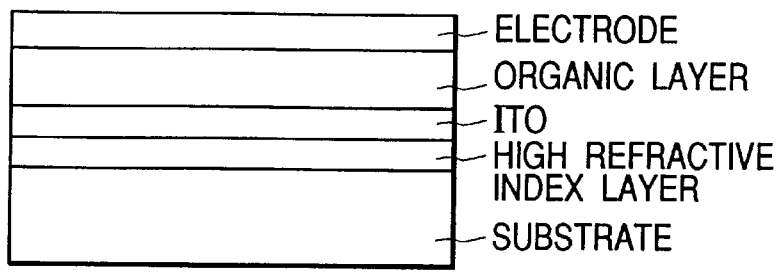
FIGS. 34–37 are sectional views of a glass substrate and layers thereon which relate to different stages during the fabrication of the organic light emitter in FIG. 12.

The organic light emitter of FIG. 12 is fabricated as follows. With reference to FIG. 34, a glass substrate is prepared. Then, a high-refractive-index layer (a dielectric layer), an ITO (indium tin oxide) layer, an organic semiconductor layer, and a metal electrode layer are successively formed on the glass substrate by vapor deposition or sputtering. Photoresist is applied onto the metal electrode layer by spin coating. As a result, a layer of photoresist is formed on the metal electrode layer.

Figure 35:
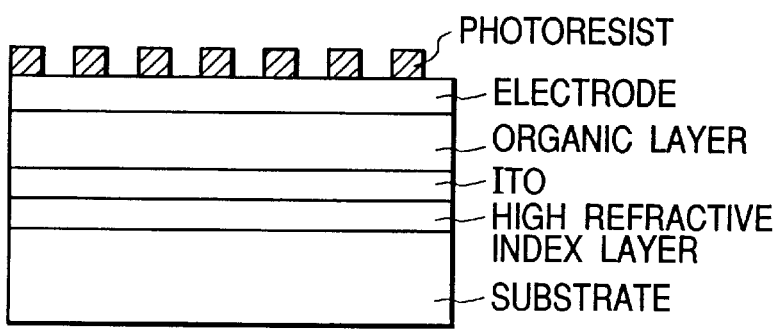

As shown in FIG. 35, the photoresist layer is made into a given shape by a patterning process using a mask. The resultant photoresist layer has segments spaced at equal intervals as viewed in a horizontal direction. As a result of the patterning process, portions of the metal electrode layer are exposed. The combination of the layers and the glass substrate is subjected to a dry etching process so that portions of the metal electrode layer which are uncovered from the photoresist segments are removed. At the same time, portions of the organic semiconductor layer are exposed.

Figure 36:
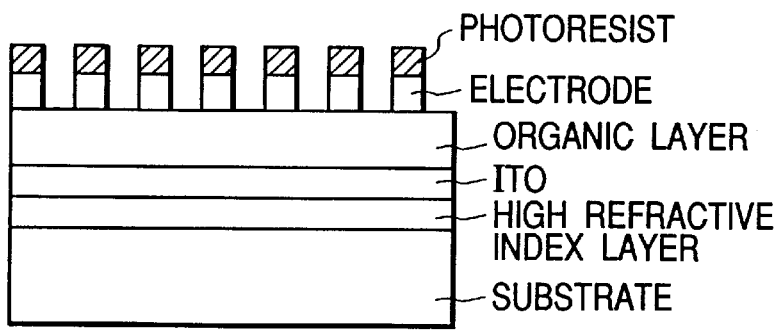
Figure 37:
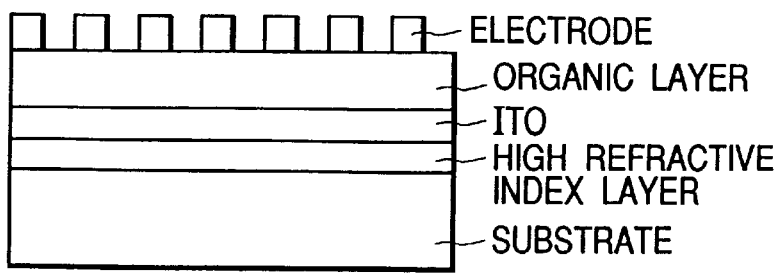

As shown in FIG. 36, remaining portions of the metal electrode layer extend below the photoresist segments, and are spaced at equal intervals as viewed along a horizontal direction. The remaining portions of the metal electrode layer form an array of metal electrodes 15E (see FIG. 12). Subsequently, as shown in FIG. 37, the photoresist segments are removed.

Twelfth Embodiment

Figure 14:
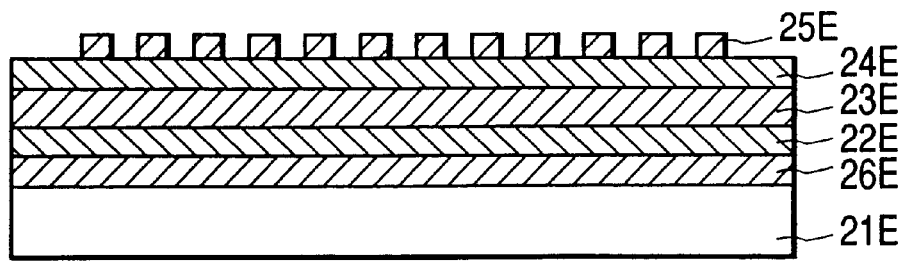
FIG. 14 is a sectional view of an organic light emitter according to a twelfth embodiment of this invention.

FIG. 14 shows an organic light emitter according to a twelfth embodiment of this invention. The organic light emitter of FIG. 14 has a multi-layer structure or a laminated structure as will be made clear later. The organic light emitter of FIG. 14 includes a glass substrate 21E having a flat upper surface. A dielectric layer 26E is formed on the upper surface of the glass substrate 21E. Preferably, the dielectric layer 26E is transparent. The dielectric layer 26E is made of, for example, titanium oxide. A transparent electrode layer 22E is formed on the dielectric layer 26E. The transparent electrode layer 22E is made of indium tin oxide (ITO). The transparent electrode layer 22E serves as an anode. A hole transport layer 23E is formed on the transparent electrode layer 22E. The hole transport layer 23E is made of triphenyldiamine, TPD [N,N'-bis(3-methylphenyl)-(1,1'-biphenyl)-4,4'-diamine]. An organic light emitting layer 24E is formed on the hole transport layer 23E. The organic light emitting layer 24E includes an organic semiconductor made of, for example, Alq [tris(8-hydroxyquinoline)aluminum]. The organic light emitting layer 24E can transport electrons. An array of metal electrodes 25E is formed on the organic light emitting layer 24E. The array of the metal electrodes 25E serves as a cathode. The metal electrodes 25E are spaced from each other at equal intervals as viewed in a direction parallel to the upper surface of the organic light emitting layer 24E, for example, in a left-right or horizontal direction of FIG. 14. Thus, the metal electrodes 25E compose a structure which is spatially periodic along a direction parallel to the upper surface of the organic light emitting layer 24E. The spatial period of this structure is equal to a given constant value.

The dielectric layer 26E has a given refractive index which is higher than the refractive indexes of the glass substrate 21E and the organic light emitting layer 24E. Preferably, the refractive index of the transparent electrode layer 22E is higher than the refractive indexes of the glass substrate 21E and the organic light emitting layer 24E. Preferably, the refractive index of the dielectric layer 26E is higher than the refractive index of the transparent electrode layer 22E.

A direct-current power source (not shown) is connected between the transparent electrode layer 22E and the array of the metal electrodes 25E to apply a driving voltage to the organic light emitter. Holes and electrons are injected into the organic light emitting layer 24E from the anode (the transparent electrode layer 22E) and the cathode (the array of the metal electrodes 25E) by the driving voltage. The injected holes and electrons meet, and cause light. In this way, the light is generated in the organic light emitting layer 24E. The generated light is propagated from the organic light emitting layer 24E to the transparent electrode layer 22E and the dielectric layer 26E via the hole transport layer 23E.

The dielectric layer 26E which is high in refractive index provides the following effect. The generated light is confined in a region between the two low-refractive-index layers, that is, the organic light emitting layer 24E and the glass substrate 21E. Specifically, the generated light is confined mainly in the dielectric layer 26E. The generated light is propagated in an optical waveguide as a forward light beam along a direction parallel to the upper surface of the glass substrate 21E, that is, a direction parallel to the plane of the boundary between the glass substrate 21E and the dielectric layer 26E.

A current flowing in the organic light emitting layer 24E has a distribution (a density distribution) which is spatially periodic in accordance with the periodic structure of the metal electrodes 25E. The spatially periodic distribution of the current causes a spatially periodic variation in the intensity of the generated light. Thus, the optical waveguide has a spatially periodic variation in complex index of refraction. The spatial period of the variation in the complex index of refraction is equal to a given constant value. A component of the forward light beam which has a wavelength tuning to the spatial period of the variation in the complex index of refraction of the optical waveguide is reflected by diffraction, thereby forming a backward light beam. The backward light beam interferes with the component of the forward light beam which has the same wavelength as that of the backward light beam. The interference causes a greater resultant light beam having a specified wavelength corresponding to the wavelength of the backward light beam. In other words, there is provided an optical resonator which extends in a direction parallel to the upper surface of the glass substrate 21E. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 21E before being emitted to an external via a lower surface of the glass substrate 21E.

Thirteenth Embodiment

Figure 15:
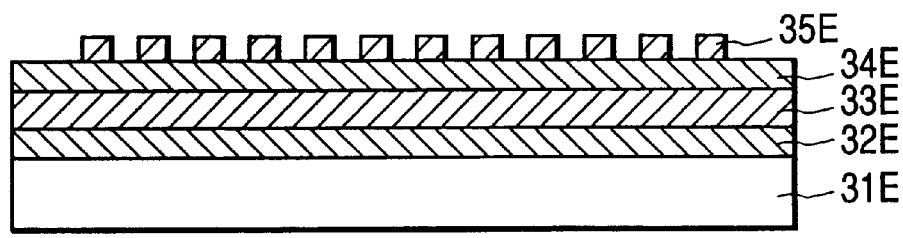
FIG. 15 is a sectional view of an organic light emitter according to a thirteenth embodiment of this invention.

FIG. 15 shows an organic light emitter according to a thirteenth embodiment of this invention. The organic light emitter of FIG. 15 has a multi-layer structure or a laminated structure as will be made clear later. The organic light emitter of FIG. 15 includes a glass substrate 31E having a flat upper surface. A transparent electrode layer 32E is formed on the upper surface of the glass substrate 31E. The transparent electrode layer 32E is made of indium tin oxide (ITO). The transparent electrode layer 32E serves as an anode. A hole transport layer 33E is formed on the transparent electrode layer 32E. The hole transport layer 33E is made of triphenyldiamine, TPD [N,N'-bis(3-methylphenyl)-(1,1'-biphenyl)-4,4'-diamine]. An organic light emitting layer 34E is formed on the hole transport layer 33E. The organic light emitting layer 34E includes an organic semiconductor made of, for example, Alq [tris(8-hydroxyquinoline)aluminum]. The organic light emitting layer 34E can transport electrons. An array of metal electrodes 35E is formed on the organic light emitting layer 34E. The array of the metal electrodes 35E serves as a cathode. The metal electrodes 35E are spaced from each other at equal intervals as viewed in a direction parallel to the upper surface of the organic light emitting layer 34E, for example, in a left-right or horizontal direction of FIG. 15. Thus, the metal electrodes 35E compose a structure which is spatially periodic along a direction parallel to the upper surface of the organic light emitting layer 34E. The spatial period of this structure is equal to a given constant value.

The transparent electrode layer 32E has a refractive index which is higher than the refractive indexes of the glass substrate 31E and the organic light emitting layer 34E.

A direct-current power source (not shown) is connected between the transparent electrode layer 32E and the array of the metal electrodes 35E to apply a driving voltage to the organic light emitter. Holes and electrons are injected into the organic light emitting layer 34E from the anode (the transparent electrode layer 32E) and the cathode (the array of the metal electrodes 35E) by the driving voltage. The injected holes and electrons meet, and cause light. In this way, the light is generated in the organic light emitting layer 34E. The generated light is propagated from the organic light emitting layer 34E to the transparent electrode layer 32E via the hole transport layer 33E.

The transparent electrode layer 32E which is high in refractive index provides the following effect. The generated light is confined in a region between the two low-refractive-index layers, that is, the organic light emitting layer 34E and the glass substrate 31E. Specifically, the generated light is confined mainly in the transparent electrode layer 32E. The generated light is propagated in an optical waveguide as a forward light beam along a direction parallel to the upper surface of the glass substrate 31E, that is, a direction parallel to the plane of the boundary between the glass substrate 31E and the transparent electrode layer 32E.

A current flowing in the organic light emitting layer 34E has a distribution (a density distribution) which is spatially periodic in accordance with the periodic structure of the metal electrodes 35E. The spatially periodic distribution of the current causes a spatially periodic variation in the intensity of the generated light. Thus, the optical waveguide has a spatially periodic variation in complex index of refraction. The spatial period of the variation in the complex index of refraction is equal to a given constant value. A component of the forward light beam which has a wavelength tuning to the spatial period of the variation in the complex index of refraction of the optical waveguide is reflected by diffraction, thereby forming a backward light beam. The backward light beam interferes with the component of the forward light beam which has the same wavelength as that of the backward light beam. The interference causes a greater resultant light beam having a specified wavelength corresponding to the wavelength of the backward light beam. In other words, there is provided an optical resonator which extends in a direction parallel to the upper surface of the glass substrate 31E. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 31E before being emitted to an external via a lower surface of the glass substrate 31E.

Fourteenth Embodiment

Figure 16:
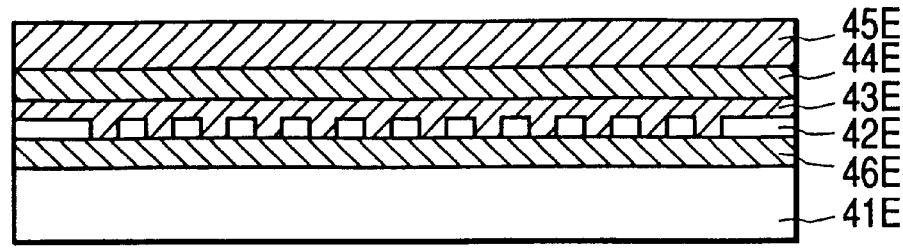
FIG. 16 is a sectional view of an organic light emitter according to a fourteenth embodiment of this invention.

FIG. 16 shows an organic light emitter according to a fourteenth embodiment of this invention. The organic light emitter of FIG. 16 has a multi-layer structure or a laminated structure as will be made clear later. The organic light emitter of FIG. 16 includes a glass substrate 41E having a flat upper surface. A dielectric layer 46E is formed on the upper surface of the glass substrate 41E. Preferably, the dielectric layer 46E is transparent. The dielectric layer 46E is made of, for example, titanium oxide. An array of transparent electrodes 42E is formed on the dielectric layer 46E. The transparent electrodes 42E are made of indium tin oxide (ITO). The array of the transparent electrodes 42E serves as an anode. The transparent electrodes 42E are spaced from each other at equal intervals as viewed in a direction parallel to the upper surface of the dielectric layer 46E, for example, in a left-right or horizontal direction of FIG. 16. Thus, the transparent electrodes 42E compose a structure which is spatially periodic along a direction parallel to the upper surface of the dielectric layer 46E. The spatial period of this structure is equal to a given constant value. The transparent electrodes 42E and portions of the upper surface of the dielectric layer 46E which are uncovered from the transparent electrodes 42E are coated with a hole transport layer 43E. The hole transport layer 43E is made of triphenyldiamine, TPD [N,N'-bis(3-methylphenyl)-(1,1'-biphenyl)-4,4'-diamine]. An organic light emitting layer 44E is formed on the hole transport layer 43E. The organic light emitting layer 44E includes an organic semiconductor made of, for example, Alq [tris(8-hydroxyquinoline)aluminum]. The organic light emitting layer 44E can transport electrons. A metal electrode layer 45E is formed on the organic light emitting layer 44E. The metal electrode layer 45E serves as a cathode.

The dielectric layer 46E has a given refractive index which is higher than the refractive indexes of the glass substrate 41E and the organic light emitting layer 44E. Preferably, the refractive index of the transparent electrodes 42E is higher than the refractive indexes of the glass substrate 41E and the organic light emitting layer 44E. Preferably, the refractive index of the dielectric layer 46E is higher than the refractive index of the transparent electrodes 42E.

A direct-current power source (not shown) is connected between the array of the transparent electrodes 42E and the metal electrode layer 45E to apply a driving voltage to the organic light emitter. Holes and electrons are injected into the organic light emitting layer 44E from the anode (the array of the transparent electrodes 42E) and the cathode (the metal electrode layer 45E) by the driving voltage. The injected holes and electrons meet, and cause light. In this way, the light is generated in the organic light emitting layer 44E. The generated light is propagated from the organic light emitting layer 44E to the transparent electrodes 42E and the dielectric layer 46E via the hole transport layer 43E.

The dielectric layer 46E which is high in refractive index provides the following effect. The generated light is confined in a region between the two low-refractive-index layers, that is, the organic light emitting layer 44E and the glass substrate 41E. Specifically, the generated light is confined mainly in the dielectric layer 46E. The generated light is propagated in an optical waveguide as a forward light beam along a direction parallel to the upper surface of the glass substrate 41E, that is, a direction parallel to the plane of the boundary between the glass substrate 41E and the dielectric layer 46E.

A current flowing in the organic light emitting layer 44E has a distribution (a density distribution) which is spatially periodic in accordance with the periodic structure of the transparent electrodes 42E. The spatially periodic distribution of the current causes a spatially periodic variation in the intensity of the generated light. Thus, the optical waveguide has a spatially periodic variation in complex index of refraction. The spatial period of the variation in the complex index of refraction is equal to a given constant value. A component of the forward light beam which has a wavelength tuning to the spatial period of the variation in the complex index of refraction of the optical waveguide is reflected by diffraction, thereby forming a backward light beam. The backward light beam interferes with the component of the forward light beam which has the same wavelength as that of the backward light beam. The interference causes a greater resultant light beam having a specified wavelength corresponding to the wavelength of the backward light beam. In other words, there is provided an optical resonator which extends in a direction parallel to the upper surface of the glass substrate 41E. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 41E before being emitted to an external via a lower surface of the glass substrate 41E.

Fifteenth Embodiment

Figure 17:
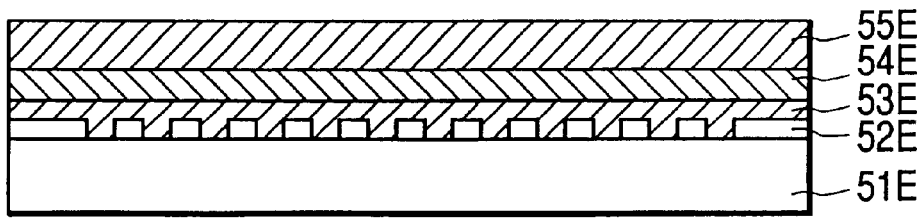
FIG. 17 is a sectional view of an organic light emitter according to a fifteenth embodiment of this invention.

FIG. 17 shows an organic light emitter according to a fifteenth embodiment of this invention. The organic light emitter of FIG. 17 has a multi-layer structure or a laminated structure as will be made clear later. The organic light emitter of FIG. 17 includes a glass substrate 51E having a flat upper surface. An array of transparent electrodes 52E is formed on the upper surface of the glass substrate 51E. The transparent electrodes 52E are made of indium tin oxide (ITO). The array of the transparent electrodes 52E serves as an anode. The transparent electrodes 52E are spaced from each other at equal intervals as viewed in a direction parallel to the upper surface of the glass substrate 51E, for example, in a left-right or horizontal direction of FIG. 17. Thus, the transparent electrodes 52E compose a structure which is spatially periodic along a direction parallel to the upper surface of the glass substrate 51E. The spatial period of this structure is equal to a given constant value. The transparent electrodes 52E and portions of the upper surface of the glass substrate 51E which are uncovered from the transparent electrodes 52E are coated with a hole transport layer 53E. The hole transport layer 53E is made of triphenyldiamine, TPD [N,N'-bis(3-methylphenyl)-(1,1'-biphenyl)-4,4'-diamine]. An organic light emitting layer 54E is formed on the hole transport layer 53E. The organic light emitting layer 54E includes an organic. semiconductor made of, for example, Alq [tris(8-hydroxyquinoline)aluminum]. The organic light emitting layer 54E can transport electrons. A metal electrode layer 55E is formed on the organic light emitting layer 54E. The metal electrode layer 55E serves as a cathode.

The transparent electrodes 52E have a given refractive index which is higher than the refractive indexes of the glass substrate 51E and the organic light emitting layer 54E.

A direct-current power source (not shown) is connected between the array of the transparent electrodes 52E and the metal electrode layer 55E to apply a driving voltage to the organic light emitter. Holes and electrons are injected into the organic light emitting layer 54E from the anode (the array of the transparent electrodes 52E) and the cathode (the metal electrode layer 55E) by the driving voltage. The injected holes and electrons meet, and cause light. In this way, the light is generated in the organic light emitting layer 54E. The generated light is propagated from the organic light emitting layer 54E to the transparent electrodes 52E via the hole transport layer 53E.

The transparent electrodes 52E which are high in refractive index provide the following effect. The generated light is confined in a region between the two low-refractive-index layers, that is, the organic light emitting layer 54E and the glass substrate 51E. Specifically, the generated light is confined mainly in the transparent electrodes 52E. The generated light is propagated in an optical waveguide as a forward light beam along a direction parallel to the upper surface of the glass substrate 51E.

A current flowing in the organic light emitting layer 54E has a distribution (a density distribution) which is spatially periodic in accordance with the periodic structure of the transparent electrodes 52E. The spatially periodic distribution of the current causes a spatially periodic variation in the intensity of the generated light. Thus, the optical waveguide has a spatially periodic variation in complex index of refraction. The spatial period of the variation in the complex index of refraction is equal to a given constant value. A component of the forward light beam which has a wavelength tuning to the spatial period of the variation in the complex index of refraction of the optical waveguide is reflected by diffraction, thereby forming a backward light beam. The backward light beam interferes with the component of the forward light beam which has the same wavelength as that of the backward light beam. The interference causes a greater resultant light beam having a specified wavelength corresponding to the wavelength of the backward light beam. In other words, there is provided an optical resonator which extends in a direction parallel to the upper surface of the glass substrate 51E. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 51E before being emitted to an external via a lower surface of the glass substrate 51E.

Sixteenth Embodiment

Figure 18:
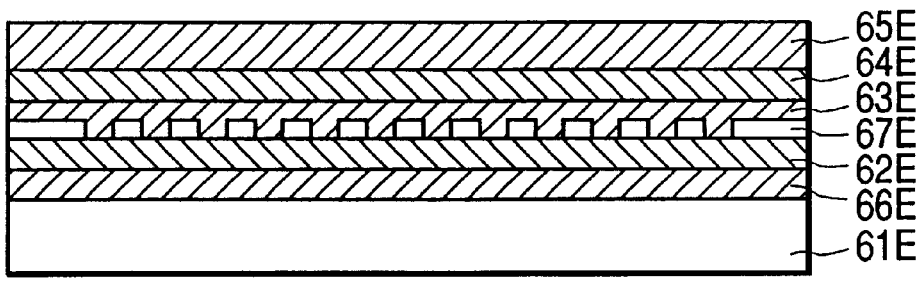
FIG. 18 is a sectional view of an organic light emitter according to a sixteenth embodiment of this invention.

FIG. 18 shows an organic light emitter according to a sixteenth embodiment of this invention. The organic light emitter of FIG. 18 has a multi-layer structure or a laminated structure as will be made clear later. The organic light emitter of FIG. 18 includes a glass substrate 61E having a flat upper surface. A dielectric layer 66E is formed on the upper surface of the glass substrate 61E. Preferably, the dielectric layer 66E is transparent. The dielectric layer 66E is made of, for example, titanium oxide. A transparent electrode layer 62E is formed on the dielectric layer 66E. The transparent electrode layer 62E is made of indium tin oxide (ITO). The transparent electrode layer 62E serves as an anode. An array of current blocking segments 67E is formed on the transparent electrode layer 62E. The current blocking segments 67E are made of, for example, insulating material. The current blocking segments 67E are spaced from each other at equal intervals as viewed in a direction parallel to the upper surface of the transparent electrode layer 62E, for example, in a left-right or horizontal direction of FIG. 18. Thus, the current blocking segments 67E compose a structure which is spatially periodic along a direction parallel to the upper surface of the transparent electrode layer 62E. The spatial period of this structure is equal to a given constant value. The current blocking segments 67E and portions of the upper surface of the transparent electrode layer 62E which are uncovered from the current blocking segments 67E are coated with a hole transport layer 63E. The hole transport layer 63E is made of triphenyldiamine, TPD [N,N'-bis(3-methylphenyl)-(1,1'-biphenyl)-4,4'-diamine]. An organic light emitting layer 64E is formed on the hole transport layer 63E. The organic light emitting layer 64E includes an organic semiconductor made of, for example, Alq [tris (8-hydroxyquinoline)aluminum]. The organic light emitting layer 64E can transport electrons. A metal electrode layer 65E is formed on the organic light emitting layer 64E. The metal electrode layer 65E serves as a cathode.

The dielectric layer 66E has a given refractive index which is higher than the refractive indexes of the glass substrate 61E and the organic light emitting layer 64E. Preferably, the refractive index of the transparent electrode layer 62E is higher than the refractive indexes of the glass substrate 61E and the organic light emitting layer 64E. Preferably, the refractive index of the dielectric layer 66E is higher than the refractive index of the transparent electrode layer 62E.

A direct-current power source (not shown) is connected between the transparent electrode layer 62E and the metal electrode layer 65E to apply a driving voltage to the organic light emitter. Holes and electrons are injected into the organic light emitting layer 64E from the anode (the transparent electrode layer 62E) and the cathode (the metal electrode layer 65E) by the driving voltage. The injected holes and electrons meet, and cause light. In this way, the light is generated in the organic light emitting layer 64E. The generated light is propagated from the organic light emitting layer 64E to the transparent electrode layer 62E and the dielectric layer 66E via the hole transport layer 63E.

The dielectric layer 66E which is high in refractive index provides the following effect. The generated light is confined in a region between the two low-refractive-index layers, that is, the organic light emitting layer 64E and the glass substrate 61E. Specifically, the generated light is confined mainly in the dielectric layer 66E. The generated light is propagated in an optical waveguide as a forward light beam along a direction parallel to the upper surface of the glass substrate 61E, that is, a direction parallel to the plane of the boundary between the glass substrate 61E and the dielectric layer 66E.

A current flowing in the organic light emitting layer 64E has a distribution (a density distribution) which is spatially periodic in accordance with the periodic structure of the current blocking segments 67E. The spatially periodic distribution of the current causes a spatially periodic variation in the intensity of the generated light. Thus, the optical waveguide has a spatially periodic variation n complex index of refraction. The spatial period of the variation in the complex index of refraction is equal to a given constant value. A component of the forward light beam which has a wavelength tuning to the spatial period of the variation in the complex index of refraction of the optical waveguide is reflected by diffraction, thereby forming a backward light beam. The backward light beam interferes with the component of the forward light beam which has the same wavelength as that of the backward light beam. The interference causes a greater resultant light beam having a specified wavelength corresponding to the wavelength of the backward light beam. In other words, there is provided an optical resonator which extends in a direction parallel to the upper surface of the glass substrate 61E. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 61E before being emitted to an external via a lower surface of the glass substrate 61E.

Seventeenth Embodiment

Figure 19:
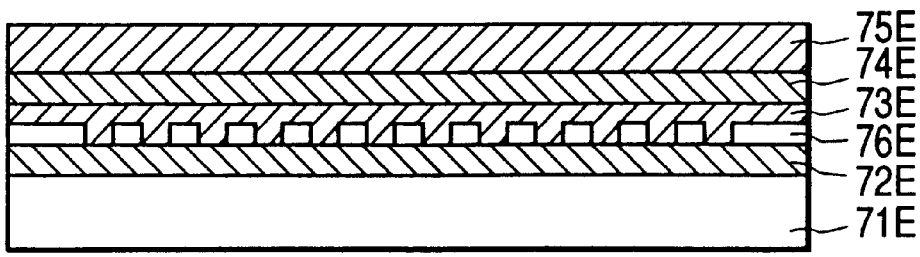
FIG. 19 is a sectional view of an organic light emitter according to a seventeenth embodiment of this invention.

FIG. 19 shows an organic light emitter according to a seventeenth embodiment of this invention. The organic light emitter of FIG. 19 has a multi-layer structure or a laminated structure as will be made clear later. The organic light emitter of FIG. 19 includes a glass substrate 71E having a flat upper surface. A transparent electrode layer 72E is formed on the upper surface of the glass substrate 71E. The transparent electrode layer 72E is made of indium tin oxide (ITO). The transparent electrode layer 72E serves as an anode. An array of insulating segments 76E is formed on the transparent electrode layer 72E. The insulating segments 76E are made of, for example, silicon oxide. The insulating segments 76E are spaced from each other at equal intervals as viewed in a direction parallel to the upper surface of the transparent electrode layer 72E, for example, in a left-right or horizontal direction of FIG. 19. Thus, the insulating segments 76E compose a structure which is spatially periodic along a direction parallel to the upper surface of the transparent electrode layer 72E. The spatial period of this structure is equal to a given constant value. The insulating segments 76E and portions of the upper surface of the transparent electrode layer 72E which are uncovered from the insulating segments 76E are coated with a hole transport layer 73E. The hole transport layer 73E is made of triphenyldiamine, TPD [N, N'-bis(3-methylphenyl)-(1,1'-biphenyl)-4,4'-diamine]. An organic light emitting layer 74E is formed on the hole transport layer 63E. The organic light emitting layer 74E includes an organic semiconductor made of, for example, Alq [tris(8-hydroxyquinoline)aluminum]. The organic light emitting layer 74E can transport electrons. A metal electrode layer 75E is formed on the organic light emitting layer 74E. The metal electrode layer 75E serves as a cathode.

The transparent electrode layer 72E has a given refractive index which is higher than the refractive indexes of the glass substrate 71E and the organic light emitting layer 74E.

A direct-current power source (not shown) is connected between the transparent electrode layer 72E and the metal electrode layer 75E to apply a driving voltage to the organic light emitter. Holes and electrons are injected into the organic light emitting layer 74E from the anode (the transparent electrode layer 72E) and the cathode (the metal electrode layer 75E) by the driving voltage. The injected holes and electrons meet, and cause light. In this way, the light is generated in the organic light emitting layer 74E. The generated light is propagated from the organic light emitting layer 74E to the transparent electrode layer 72E via the hole transport layer 73E.

The transparent electrode layer 72E which is high in refractive index provides the following effect. The generated light is confined in a region between the two low-refractive-index layers, that is, the organic light emitting layer 74E and the glass substrate 71E. Specifically, the generated light is confined mainly in the transparent electrode layer 72E. The generated light is propagated in an optical waveguide as a forward light beam along a direction parallel to the upper surface of the glass substrate 71E.

A current flowing in the organic light emitting layer 74E has a distribution (a density distribution) which is spatially periodic in accordance with the periodic structure of the insulating segments 76E. The spatially periodic distribution of the current causes a spatially periodic variation in the intensity of the generated light. Thus, the optical waveguide has a spatially periodic variation n complex index of refraction. The spatial period of the variation in the complex index of refraction is equal to a given constant value. A component of the forward light beam which has a wavelength tuning to the spatial period of the variation in the complex index of refraction of the optical waveguide is reflected by diffraction, thereby forming a backward light beam. The backward light beam interferes with the component of the forward light beam which has the same wavelength as that of the backward light beam. The interference causes a greater resultant light beam having a specified wavelength corresponding to the wavelength of the backward light beam. In other words, there is provided an optical resonator which extends in a direction parallel to the upper surface of the glass substrate 71E. The optical resonator selects a component of the generated light beam which has a given wavelength corresponding to the resonance frequency thereof. Thus, in a spectrum domain (a wavelength domain), the resultant light has great intensities at and around the given wavelength determined by the optical resonator. The resultant light is scattered in the optical waveguide, moving out of the optical waveguide and then passing through the glass substrate 71E before being emitted to an external via a lower surface of the glass substrate 71E.

Figure 38:
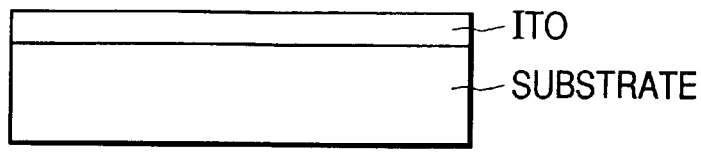
FIGS. 38–44 are sectional views of a glass substrate and layers thereon which relate to different stages during the fabrication of the organic light emitter in FIG. 19.

The organic light emitter of FIG. 19 is fabricated as follows. With reference to FIG. 38, a glass substrate is prepared, and then an ITO (indium tin oxide) layer is formed on the glass substrate by vapor deposition or sputtering.

Figure 39:
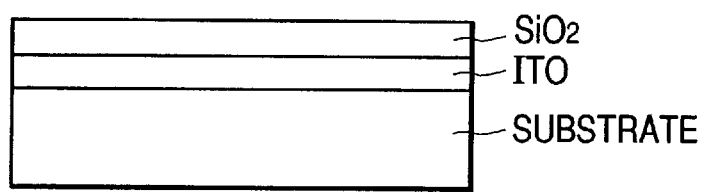

As shown in FIG. 39, an insulating layer, for example, an $SiO_2$ layer, is formed on the ITO layer by vapor deposition or sputtering. Photoresist is applied onto the insulating layer by spin coating. As a result, a layer of photoresist is formed on the insulating layer.

Figure 40:
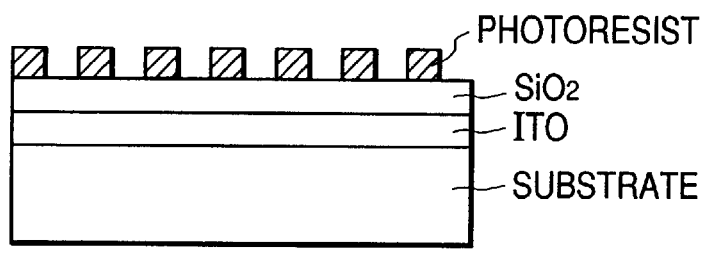

As shown in FIG. 40, the photoresist layer is made into a given shape by a patterning process using a mask. The resultant photoresist layer has segments spaced at equal intervals as viewed in a horizontal direction. As a result of the patterning process, portions of the insulating layer are exposed. The combination of the layers and the glass substrate is subjected to a dry etching process so that portions of the insulating layer which are uncovered from the photoresist segments are removed. At the same time, portions of the ITO layer are exposed.

Figure 41:
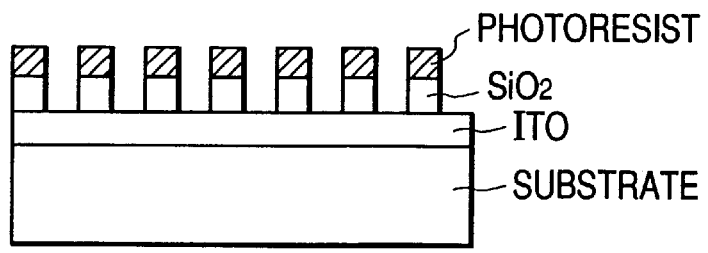
Figure 42:
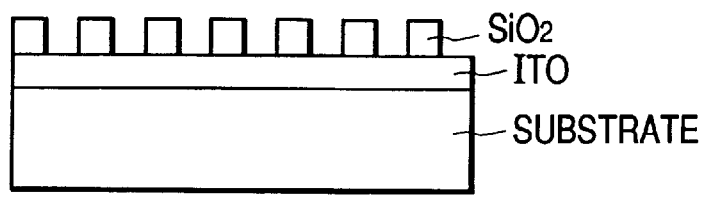

As shown in FIG. 41, remaining portions of the insulating layer (the $SiO_2$ layer) extend below the photoresist segments, and are spaced at equal intervals as viewed along a horizontal direction. The remaining portions of the insulating layer form an array of insulating segments 76E (see FIG. 19). Subsequently, as shown in FIG. 42, the photoresist segments are removed.

Figure 43:
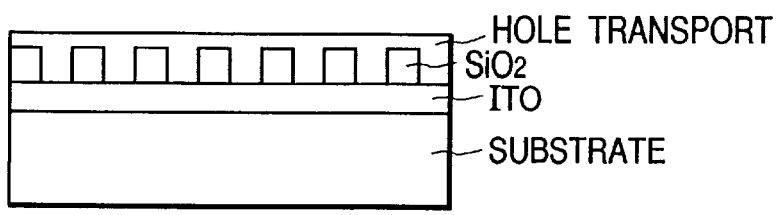
Figure 44:
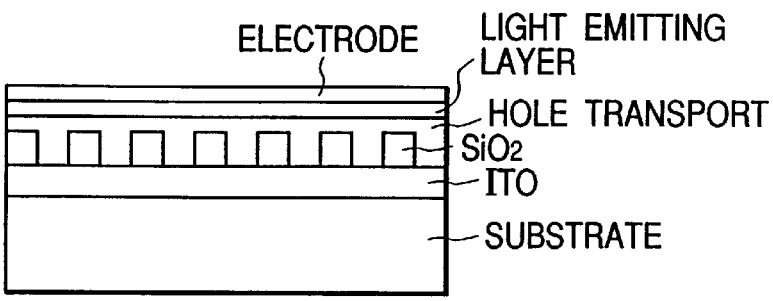

Then, as shown in FIG. 43, a hole transport layer is formed on the insulating segments and exposed portions of the ITO layer. Subsequently, as shown in FIG. 44, an organic light emitting layer and a metal electrode layer are successively formed on the hole transport layer.

Eighteenth Embodiment

Figure 20:
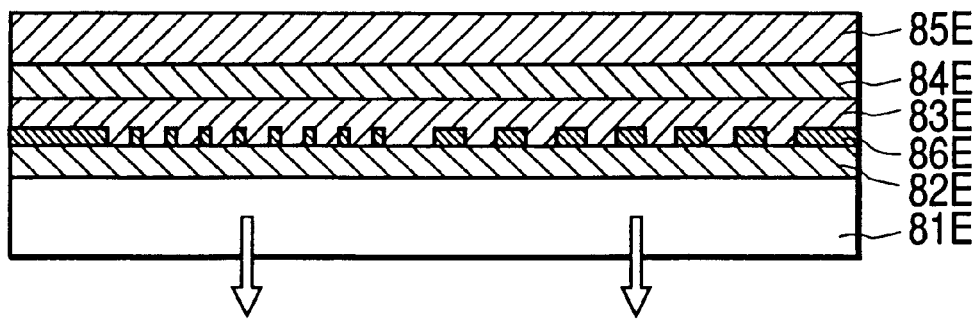
FIG. 20 is a sectional view of an organic light emitter according to an eighteenth embodiment of this invention.

FIG. 20 shows an organic light emitter according to an eighteenth embodiment of this invention. The organic light emitter of FIG. 20 has a multi-layer structure or a laminated structure as will be made clear later. The organic light emitter of FIG. 20 includes a glass substrate 81E having a flat upper surface. A transparent electrode layer 82E is formed on the upper surface of the glass substrate 81E. The transparent electrode layer 82E is made of indium tin oxide (ITO). The transparent electrode layer 82E serves as an anode. An array of insulating segments 86E is formed on the transparent electrode layer 82E. The insulating segments 86E are made of, for example, silicon oxide. The insulating segments 86E and portions of the upper surface of the transparent electrode layer 82E which are uncovered from the insulating segments 86E are coated with a hole transport layer 83E. The hole transport layer 83E is made of triphenyldiamine, TPD [N,N'-bis(3-methylphenyl)-(1,1'- biphenyl)-4,4'-diamine]. An organic light emitting layer 84E is formed on the hole transport layer 83E. The organic light emitting layer 84E includes an organic semiconductor made of, for example, Alq [tris(8-hydroxyquinoline)aluminum]. The organic light emitting layer 84E can transport electrons. A metal electrode layer 85E is formed on the organic light emitting layer 84E. The metal electrode layer 85E serves as a cathode.

The array of the insulting segments 86E has a first effective area and a second effective area spaced from each other as viewed in a direction parallel to the upper surface of the transparent electrode layer 82E. The insulating segments 86E in the first effective area of the array are spaced from each other at first equal intervals as viewed in a direction parallel to the upper surface of the transparent electrode layer 82E, for example, in a left-right or horizontal direction of FIG. 20. Thus, the insulating segments 86E compose a structure which is spatially periodic along a direction parallel to the upper surface of the transparent electrode layer 82E. The spatial period of this structure in the first effective area of the array is equal to a first given constant value. The insulating segments 86E in the second effective area of the array are spaced from each other at second equal intervals (different from the first interval) as viewed in a direction parallel to the upper surface of the transparent electrode layer 82E, for example, in a left-right or horizontal direction of FIG. 20. Thus, the insulating segments 86E compose a structure which is spatially periodic along a direction parallel to the upper surface of the transparent electrode layer 82E. The spatial period of this structure in the second effective area of the array is equal to a second given constant value different from the first given constant value.

The transparent electrode layer 82E has a given refractive index which is higher than the refractive indexes of the glass substrate 81E and the organic light emitting layer 84E.

A direct-current power source (not shown) is connected between the transparent electrode layer 82E and the metal electrode layer 85E to apply a driving voltage to the organic light emitter. Holes and electrons are injected into the organic light emitting layer 84E from the anode (the transparent electrode layer 82E) and the cathode (the metal electrode layer 85E) by the driving voltage. The injected holes and electrons meet, and cause light. In this way, the light is generated in the organic light emitting layer 84E. The generated light is propagated from the organic light emitting layer 84E to the transparent electrode layer 82E via the hole transport layer 83E.

The transparent electrode layer 82E which is high in refractive index provides the following effect. The generated light is confined in a region between the two low-refractive-index layers, that is, the organic light emitting layer 84E and the glass substrate 81E. Specifically, the generated light is confined mainly in the transparent electrode layer 82E. The generated light is propagated in an optical waveguide as a forward light beam along a direction parallel to the upper surface of the glass substrate 81E.

The array of the insulating segments 86E provides the following effect. In a region corresponding to the first effective area of the array, a current flowing in the organic light emitting layer 84E has a distribution (a density distribution) which is spatially periodic in accordance with the periodic structure of the insulating segments 86E. The spatially periodic distribution of the current causes a spatially periodic variation in the intensity of the generated light. Thus, the optical waveguide has a spatially periodic variation in complex index of refraction. The spatial period of the variation in the complex index of refraction is equal to a first given constant value. A component of the forward light beam which has a wavelength tuning to the spatial period of the variation in the complex index of refraction of the optical waveguide is reflected by diffraction, thereby forming a backward light beam. The backward light beam interferes with the component of the forward light beam which has the same wavelength as that of the backward light beam. The interference causes a greater resultant light beam having a specified wavelength corresponding to the wavelength of the backward light beam. In other words, there is provided a first optical resonator which extends in a direction parallel to the upper surface of the glass substrate 81E. The first optical resonator selects a component of the generated light beam which has a first given wavelength corresponding to the resonance frequency thereof. Thus, in a spectrum domain (a wavelength domain), the resultant light has great intensities at and around the first given wavelength determined by the first optical resonator. In the region corresponding to the first effective area of the array of the insulating segments 86E, the resultant light is scattered in the optical waveguide, moving out of the optical waveguide and then passing through the glass substrate 81E before being emitted to an external via a lower surface of the glass substrate 81E.

In a region corresponding to the second effective area of the array of the insulating segments 86E, a current flowing in the organic light emitting layer 84E has a distribution (a density distribution) which is spatially periodic in accordance with the periodic structure of the insulating segments 86E. The spatially periodic distribution of the current causes a spatially periodic variation in the intensity of the generated light. Thus, the optical waveguide has a spatially periodic variation in complex index of refraction. The spatial period of the variation in the complex index of refraction is equal to a second given constant value different from the first given constant value. A component of the forward light beam which has a wavelength tuning to the spatial period of the variation in the complex index of refraction of the optical waveguide is reflected by diffraction, thereby forming a backward light beam. The backward light beam interferes with the component of the forward light beam which has the same wavelength as that of the backward light beam. The interference causes a greater resultant light beam having a specified wavelength corresponding to the wavelength of the backward light beam. In other words, there is provided a second optical resonator which extends in a direction parallel to the upper surface of the glass substrate 81E. The second optical resonator selects a component of the generated light beam which has a second given wavelength corresponding to the resonance frequency thereof and differing from the first given wavelength. Thus, in a spectrum domain (a wavelength domain), the resultant light has great intensities at and around the second given wavelength determined by the second optical resonator. In the region corresponding to the second effective area of the array of the insulating segments 86E, the resultant light is scattered in the optical waveguide, moving out of the optical waveguide and then passing through the glass substrate 81E before being emitted to an external via a lower surface of the glass substrate 81E.

The organic light emitter of FIG. 20 may be modified into a structure having three different optical resonators caused by three separate arrays of insulating segments which have different spatial periods respectively. Preferably, the optical resonators are tuned to red light, green light, and blue light respectively.

Nineteenth Embodiment

Figure 21:
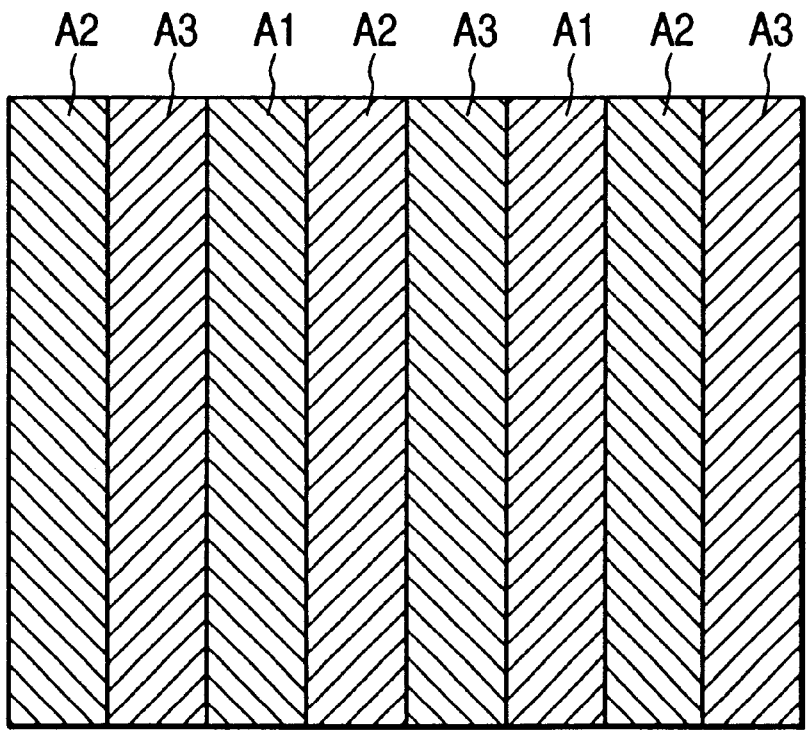
FIG. 21 is a diagram of an organic light emitter according to a nineteenth embodiment of this invention.

FIG. 21 shows an organic light emitter according to a nineteenth embodiment of this invention which is a modification of one of the eleventh embodiment to the eighteenth embodiment of this invention.

The organic light emitter of FIG. 21 has recurrent groups each having a first stripe area A1, a second stripe area A2, and a third stripe area A3. In each group, the first, second, and third stripe areas A1, A2, and A3 have structures which are spatially periodic in different directions respectively. In each group, the directions of current distributions in the first, second, and third stripe areas A1, A2, and A3 are different from each other. Furthermore, the directions of the planes of polarization of the light beams emitted from the first, second, and third stripe areas A1, A2, and A3 are perpendicular to the spatial periods of the structures therein respectively, and are thus different from each other.

In the case where an image is formed by three light beams different from each other in direction of polarization, that is, the light beams emitted from the first, second, and third stripe areas A1, A2, and A3, a stereographical picture is provided by observing the image through a polarization beam splitter.

What is claimed is:

1. An organic light emitter comprising:
   an anode;
   a cathode;
   a first layer of organic material which includes a light emitting layer, and which extends between the anode and the cathode;
   a second layer having a refractive index higher than a refractive index of the light emitting layer;
   a substrate; and
   means for optically coupling the second layer and the light emitting layer to cause an optical waveguide which propagates light generated by the light emitting layer along a direction parallel to a surface of the substrate;
   wherein at least part of the optical waveguide has an effective refractive index which spatially and periodically varies in a direction parallel to the surface of the substrate.

2. An organic light emitter as recited in claim 1, wherein an optical length corresponding to a period of the variation in the effective refractive index of the optical waveguide is equal to an integer multiple of a half of a wavelength of the light generated by the light emitting layer.

3. An organic light emitter as recited in claim 2, wherein the optical length corresponding to the period of the variation in the effective refractive index of the optical waveguide is equal to the half of the wavelength of the light generated by the light emitting layer.

4. An organic light emitter as recited in claim 2, wherein the optical length corresponding to the period of the variation in the effective refractive index of the optical waveguide is equal to the wavelength of the light generated by the light emitting layer.

5. An organic light emitter as recited in claim 1, wherein the optical waveguide is adjacent to the light emitting layer, and one of the anode and the cathode includes a transparent electrode, and the light generated by the light emitting layer is outputted to an external via the transparent electrode, and the outputted light forms a beam having a plane shape.

6. An organic light emitter comprising:
   an anode;
   a cathode;
   a first layer of organic material which includes a light emitting layer, and which extends between the anode and the cathode;
   a substrate; and
   a second layer having a refractive index higher than a refractive index of the light emitting layer, and being optically coupled to the light emitting layer to cause an optical waveguide which propagates light generated by the light emitting layer along a direction parallel to a surface of the substrate;
   wherein at least part of the optical waveguide has an effective refractive index which spatially and periodically varies in a direction parallel to the surface of the substrate to cause an optical resonator operating on the light generated by the light emitting layer.

7. An organic light emitter comprising:
   an anode;
   a cathode;
   a first layer of organic material which includes a light emitting layer, and which extends between the anode and the cathode;
   a substrate; and
   a second layer having a refractive index higher than a refractive index of the light emitting layer, and being optically coupled to the light emitting layer to cause an optical waveguide which propagates light generated by the light emitting layer;
   wherein the second layer includes at least first and second regions separate from each other, and the first region has an effective refractive index which spatially and periodically varies at a first predetermined period, and the second region has an effective refractive index which spatially and periodically varies at a second predetermined period different from the first predetermined period.

8. An organic light emitter as recited in claim 7, wherein the second layer includes first, second, and third regions separate from each other, and the first region has an effective refractive index which spatially and periodically varies at a first predetermined period corresponding to a wavelength of red light, and the second region has an effective refractive index which spatially and periodically varies at a second predetermined period corresponding to a wavelength of green light, and the third region has an effective refractive index which spatially and periodically varies at a third predetermined period corresponding to a wavelength of blue light.

9. An organic light emitter comprising:
   an anode;
   a cathode;
   a layer of organic material which includes a light emitting layer, and which extends between the anode and the cathode;
   a substrate; and
   a transparent layer being adjacent to and optically coupled to the light emitting layer and having a refractive index which is higher than a refractive index of the light emitting layer to cause an optical waveguide;
   wherein the refractive index of the transparent layer spatially and periodically varies, and the optical waveguide propagates light emitted by the light emitting layer and has an effective refractive index which spatially and periodically varies in a direction parallel to a surface of the substrate in accordance with the spatial periodic variation in the refractive index of the transparent layer.

10. An organic light emitter as recited in claim 9, wherein the transparent layer includes one of the anode and the cathode, and has a composition which spatially and periodically varies in a predetermined direction with respect to the transparent layer.

11. An organic light emitter as recited in claim 9, wherein the transparent layer includes one of the anode and the cathode, and has a thickness which spatially and periodically varies in a predetermined direction with respect to the transparent layer.

12. An organic light emitter comprising:
an anode;
a cathode;
a layer of organic material which includes a light emitting layer, and which extends between the anode and the cathode;
a substrate;
a first transparent layer being adjacent to the light emitting layer and having a refractive index which is higher than a refractive index of the light emitting layer; and
a second transparent layer having a refractive index which spatially and periodically varies;
wherein the first and second transparent layers cause an optical waveguide, and the optical waveguide propagates light emitted by the light emitting layer and has an effective refractive index which spatially and periodically varies in a direction parallel to a surface of the substrate in accordance with the spatial period variation in the refractive index of the second transparent layer.

13. An organic light emitter as recited in claim 12, wherein the second transparent layer includes a film of organic material, and the organic material film has a composition which spatially and periodically varies in a predetermined direction with respect to the organic material film.

14. An organic light emitter as recited in claim 12, wherein the second transparent layer includes a dielectric layer, and the dielectric layer has a composition which spatially and periodically varies in a predetermined direction with respect to the dielectric layer.

15. An organic light emitter as recited in claim 12, wherein the second transparent layer includes a dielectric layer, and the dielectric layer has a thickness which spatially and periodically varies in a predetermined direction with respect to the dielectric layer.

16. An organic light emitter as recited in claim 12, wherein the second transparent layer includes a plurality of dielectric layers, and at least one of the dielectric layers has a thickness and a composition one of which spatially and periodically varies in a predetermined direction with respect to the dielectric layer.

17. An organic light emitter as recited in claim 12, wherein the anode comprises a transparent electrode.

18. An organic light emitter as recited in claim 17, wherein the transparent electrode has a refractive index higher than a refractive index of the light emitting layer.

19. An organic light emitter comprising:
an anode;
a cathode;
a first layer of organic material which includes a light emitting layer, and which extends between the anode and the cathode;
a second layer having a refractive index higher than a refractive index of the light emitting layer to cause an optical waveguide for propagating light generated by the light emitting layer; and
a portion for enabling a density of a current in the light emitting layer to periodically vary in a spatial domain.

20. An organic light emitter as recited in claim 19, wherein one of the anode and the cathode includes a transparent electrode, and the light generated by the light emitting layer is outputted to an external via the transparent electrode, and the outputted light forms a polarized beam.

21. An organic light emitter as recited in claim 19, wherein the portion includes the cathode which has a spatially periodic structure.

22. An organic light emitter as recited in claim 21, wherein the second layer includes a transparent dielectric layer.

23. An organic light emitter as recited in claim 21, wherein the second layer includes a transparent electrode forming the anode.

24. An organic light emitter as recited in claim 19, wherein the portion includes the anode which has a spatially periodic structure.

25. An organic light emitter as recited in claim 24, wherein the second layer includes a transparent dielectric layer.

26. An organic light emitter as recited in claim 24, wherein the second layer includes a transparent electrode forming the anode.

27. An organic light emitter as recited in claim 19, wherein the portion includes current blocking segments extending between the anode and the cathode, and spaced at a predetermined period.

28. An organic light emitter as recited in claim 27, wherein the second layer includes a transparent dielectric layer.

29. An organic light emitter as recited in claim 19, wherein the portion includes a plurality of different regions for enabling the current density to vary in the spatial domain at different periods respectively.

30. An organic light emitter as recited in claim 29, wherein the optical waveguide is formed with current injection regions having periods in different directions respectively.

31. An organic light emitter as recited in claim 19, wherein the portion includes first, second, and third regions separate from each other, the first region enabling the current density to vary in the spatial domain at a first predetermined period corresponding to a wavelength of red light, the second region enabling the current density to vary in the spatial domain at a second predetermined period corresponding to a wavelength of green light, the third region enabling the current density to vary in the spatial domain at a third predetermined period corresponding to a wavelength of blue light.

32. An organic light emitter comprising:
an anode;
a cathode;
a first layer of organic material which includes a light emitting layer, and which extends between the anode and the cathode;
an optical waveguide for propagating light generated by the light emitting layer; and
a portion for enabling a density of a current in the light emitting layer to periodically vary in a spatial domain;
wherein an effective refractive index of the optical waveguide spatially and periodically varies in accordance with the spatially periodic variation in the current density so that an optical resonator is caused which operates on the light generated by the light emitting layer.

33. An organic light emitter as recited in claim 32, wherein an optical length corresponding to a period of the variation in the effective refractive index of the optical waveguide is equal to an integer multiple of a half of a wavelength of the light generated by the light emitting layer.

34. An organic light emitter as recited in claim 33, wherein the optical length corresponding to the period of the variation in the effective refractive index of the optical waveguide is equal to the wavelength of the light generated by the light emitting layer.

35. An organic light emitter comprising:

an anode;

a cathode;

a first layer of organic material which includes a light emitting layer, and which extends between the anode and the cathode;

a substrate;

a second layer optically coupled to the light emitting layer and having a refractive index higher than a refractive index of the light emitting layer to cause an optical waveguide for propagating light generated by the light emitting layer in a direction parallel to a surface of the substrate; and a portion for enabling a density of a current in the light emitting layer to periodically vary in a spatial domain.

* * * * *

UNITED STATES PATENT AND TRADEMARK OFFICE
CERTIFICATE OF CORRECTION

PATENT NO. : 6,392,338 B1
DATED : May 21, 2002
INVENTOR(S) : Yoshikazu Hori et al.

It is certified that error appears in the above-identified patent and that said Letters Patent is hereby corrected as shown below:

<u>Title page,</u>
Item [30], Foreign Application Priority Data,
Please delete "11-113149"; and insert -- 10-113149 --

Signed and Sealed this

Twenty-third Day of December, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,392,338 B1
DATED : May 21, 2002
INVENTOR(S) : Yoshikazu Hori et al.

It is certified that error appears in the above-identified patent and that said Letters Patent is hereby corrected as shown below:

<u>Title page,</u>
Item [73], Assignee,
Please delete "Matsushita Electrical Industrial Co., Ltd."; please insert -- Matsushita Electric Industrial Co., Ltd. --

Signed and Sealed this

Thirtieth Day of March, 2004

JON W. DUDAS
*Acting Director of the United States Patent and Trademark Office*